United States Patent
Kurose et al.

(10) Patent No.: US 9,606,511 B2
(45) Date of Patent: Mar. 28, 2017

(54) ANALOG/DIGITAL CONVERSION CIRCUIT

(71) Applicant: Kabushiki Kaisha Toshiba, Minato-ku, Tokyo (JP)

(72) Inventors: Daisuke Kurose, Yokohama Kanagawa (JP); Tomohiko Sugimoto, Yokohama Kanagawa (JP); Hirotomo Ishii, Kamakura Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/065,395

(22) Filed: Mar. 9, 2016

(65) Prior Publication Data
US 2016/0274546 A1   Sep. 22, 2016

(30) Foreign Application Priority Data
Mar. 16, 2015   (JP) .................... 2015-052693

(51) Int. Cl.
*H03M 1/50*   (2006.01)
*G04F 10/00*   (2006.01)

(52) U.S. Cl.
CPC ................ *G04F 10/005* (2013.01)

(58) Field of Classification Search
CPC ................................ G04F 10/005
USPC ........................ 341/155, 144, 166
See application file for complete search history.

(56) References Cited

U.S. PATENT DOCUMENTS

| 2001/0011881 A1* | 8/2001 | Emori ............ G01R 19/16542 320/116 |
| 2004/0056202 A1 | 3/2004 | Rao |
| 2005/0190096 A1* | 9/2005 | Isomura ................ H03M 1/56 341/166 |

FOREIGN PATENT DOCUMENTS

| JP | 2005-091206 A | 4/2005 |
| JP | 2014-155152 A | 8/2014 |
| WO | 2015/174166 A1 | 11/2015 |

OTHER PUBLICATIONS

L. Brooks et al., "A Zero-Crossing-Based 8bit 200MS/s Pipelined ADC", IEEE Journal on Solid-State Circuits, vol. 42, No. 12, pp. 2677-2687 (Dec. 2007).
B. Hershberg et al., "Ring Amplifiers for Switched Capacitor Circuits", IEEE Journal on Solid-State Circuits, vol. 47, No. 12, pp. 2928-2942, (Dec. 2012).

* cited by examiner

*Primary Examiner* — Peguy Jean Pierre
(74) *Attorney, Agent, or Firm* — White & Case LLP

(57) ABSTRACT

According to one embodiment, a first AD converter converts a first voltage into a first digital signal. A voltage/time conversion circuit acquires a residual corresponding to a difference between the first voltage and a result of having converted the first digital signal into an analog signal and converts the residual into a time signal according to a voltage in a first capacitor. A time/voltage conversion circuit converts the time signal into a voltage signal according to a voltage in a second capacitor. A second AD converter converts the voltage signal into a second digital signal. A digital processing circuit outputs a third digital signal to adjust a current value of first or the second current sources based on the second digital signal.

18 Claims, 17 Drawing Sheets

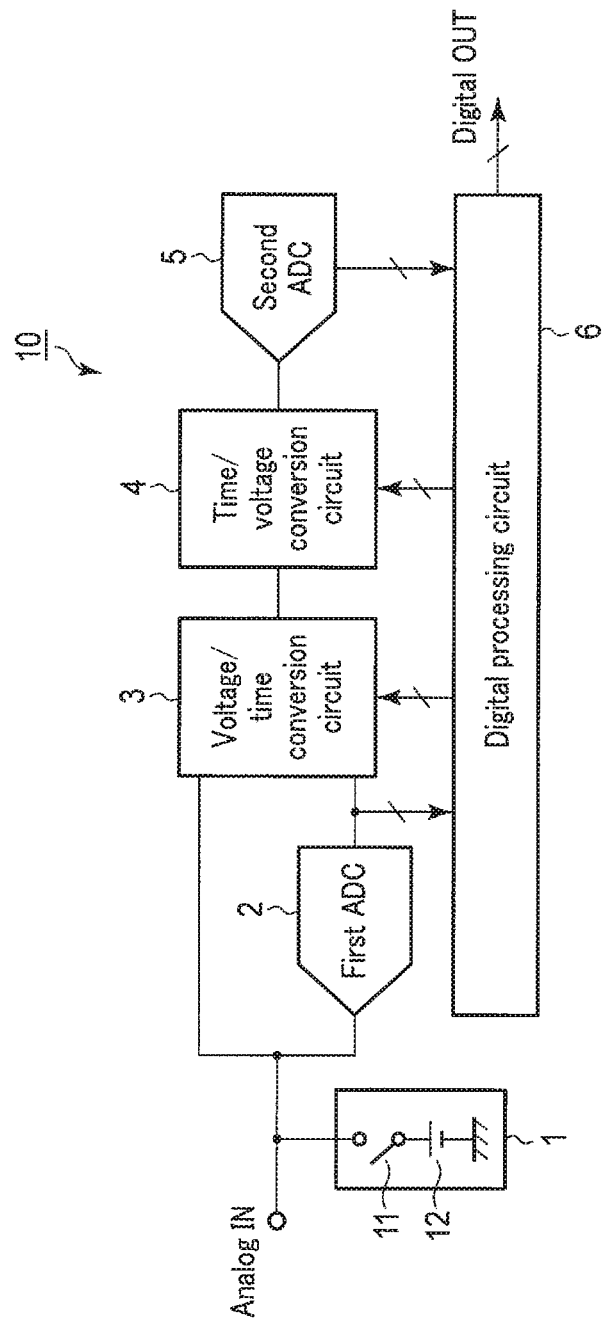
F I G. 1

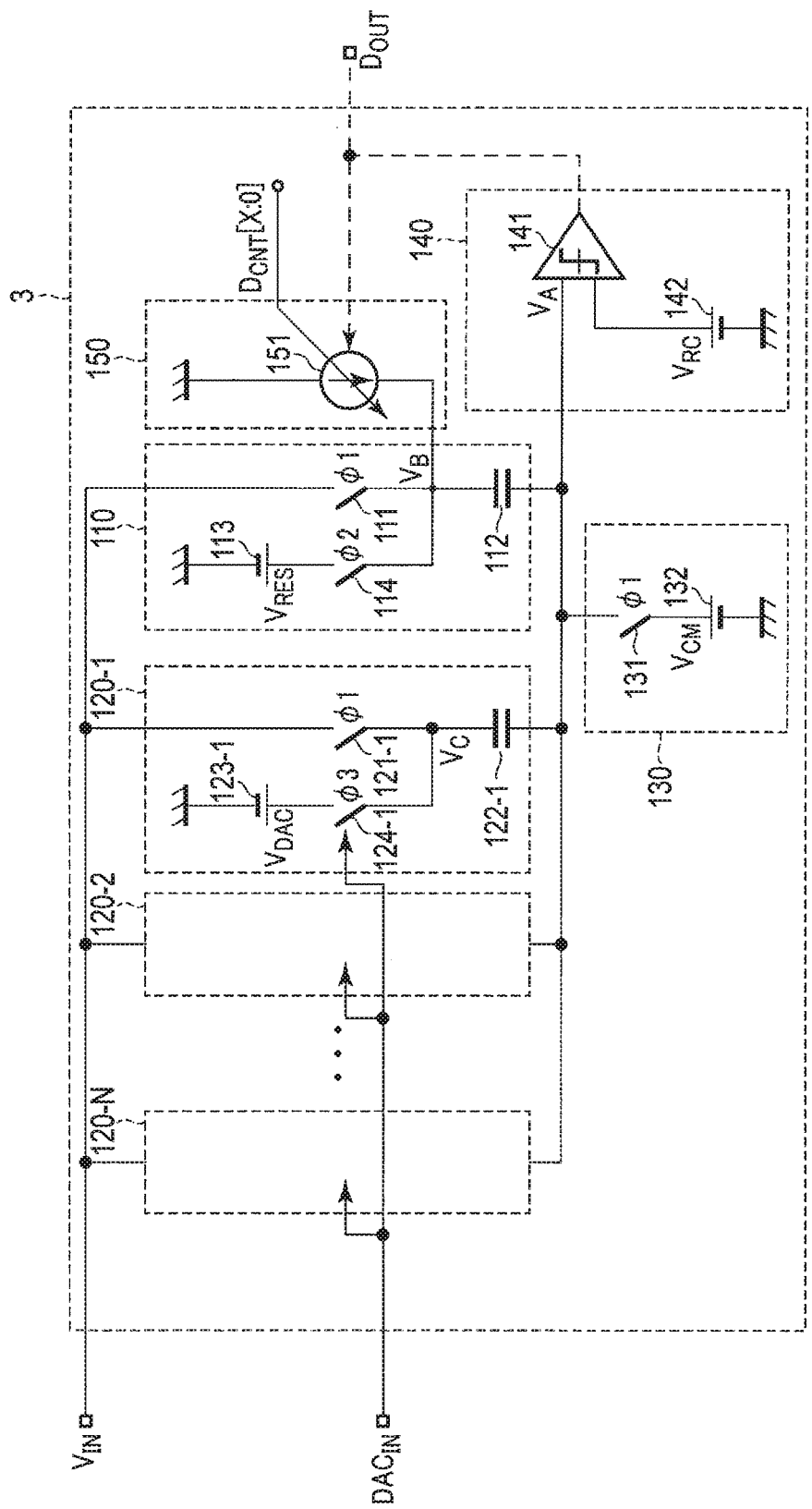
F I G. 2A

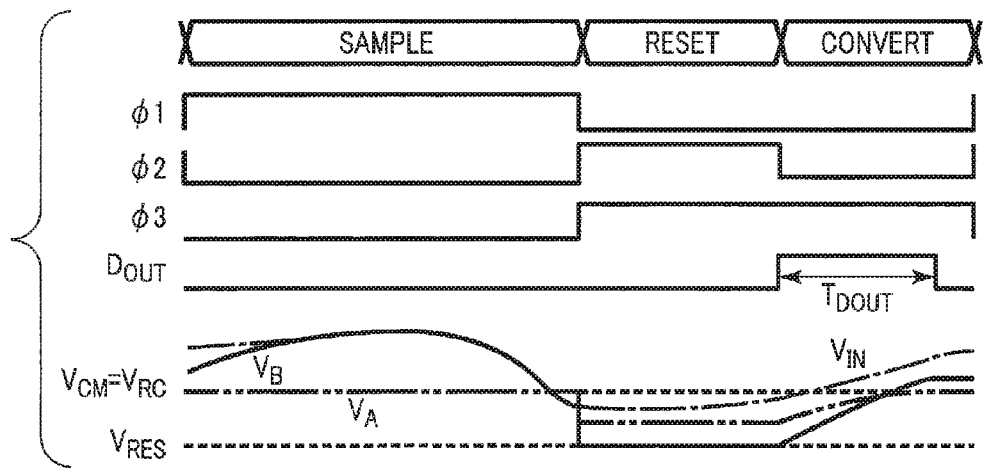
F I G. 3
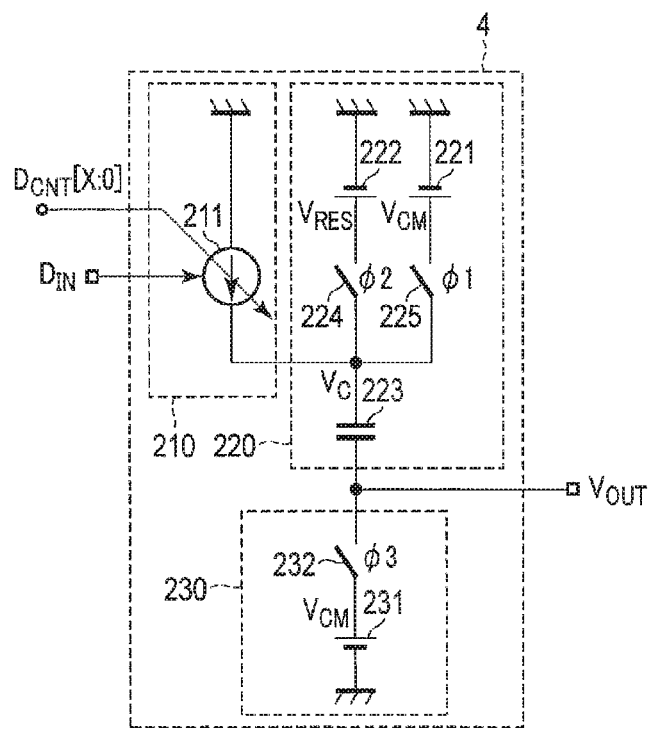
F I G. 4

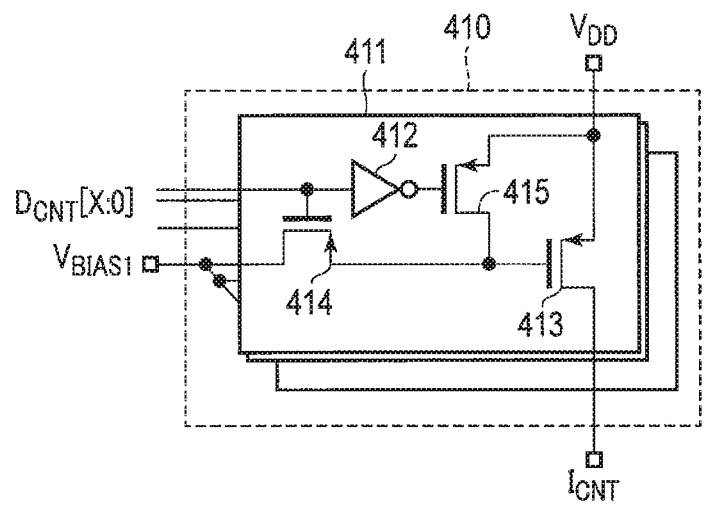
F I G. 7
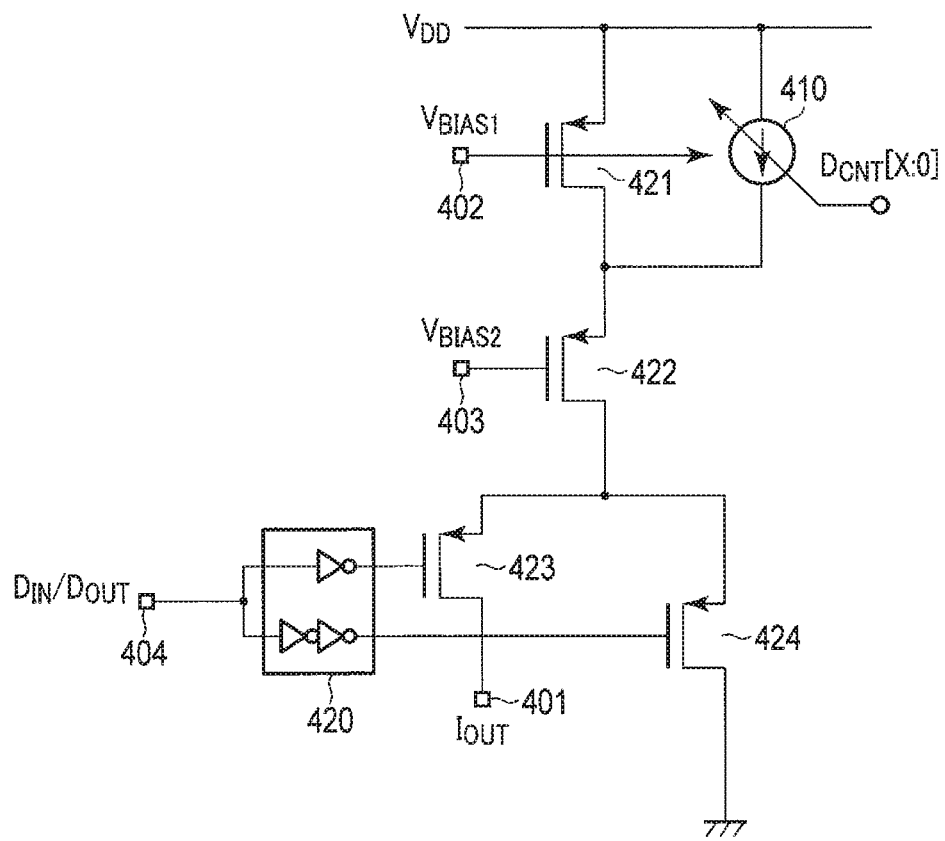
F I G. 8

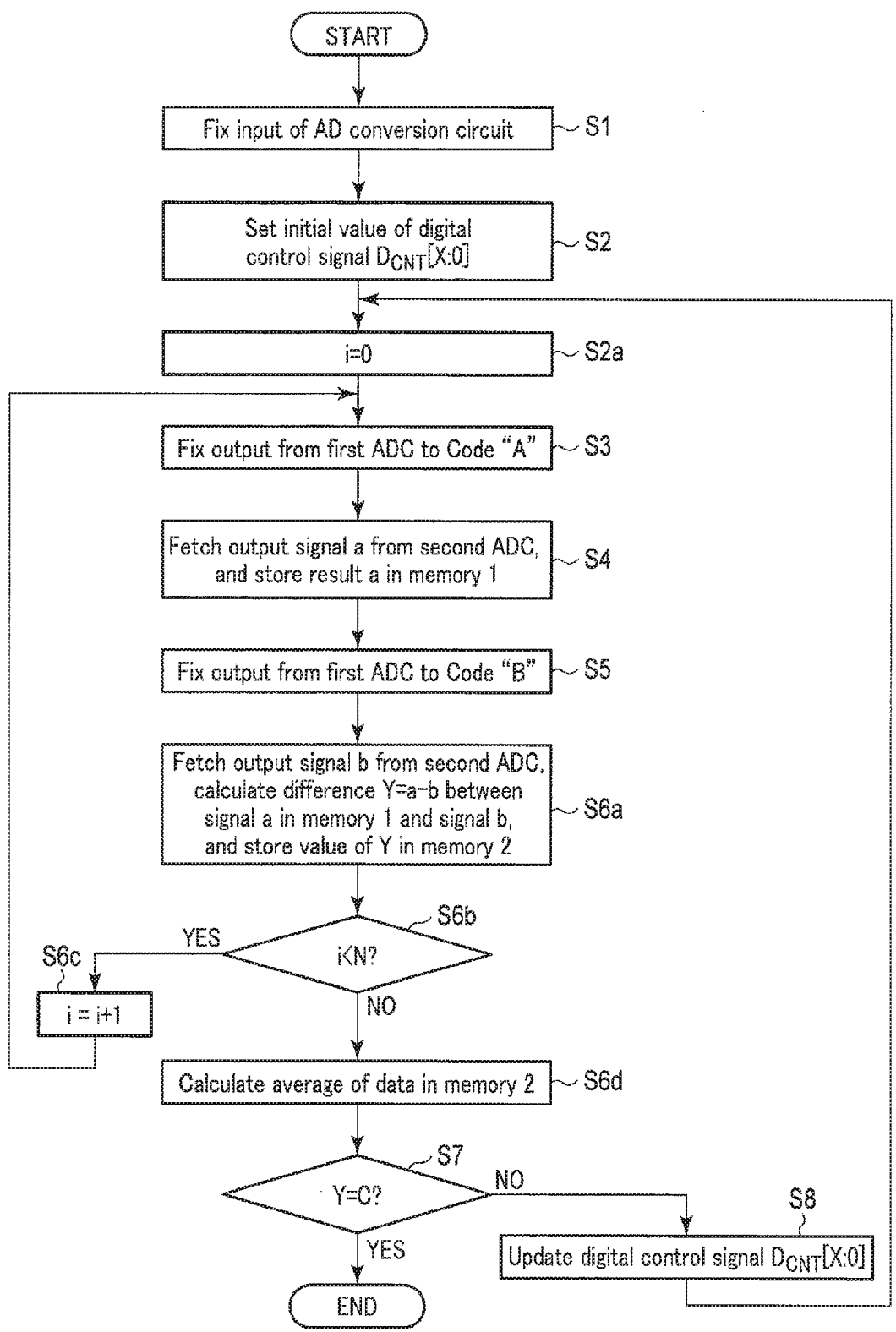
F I G. 12

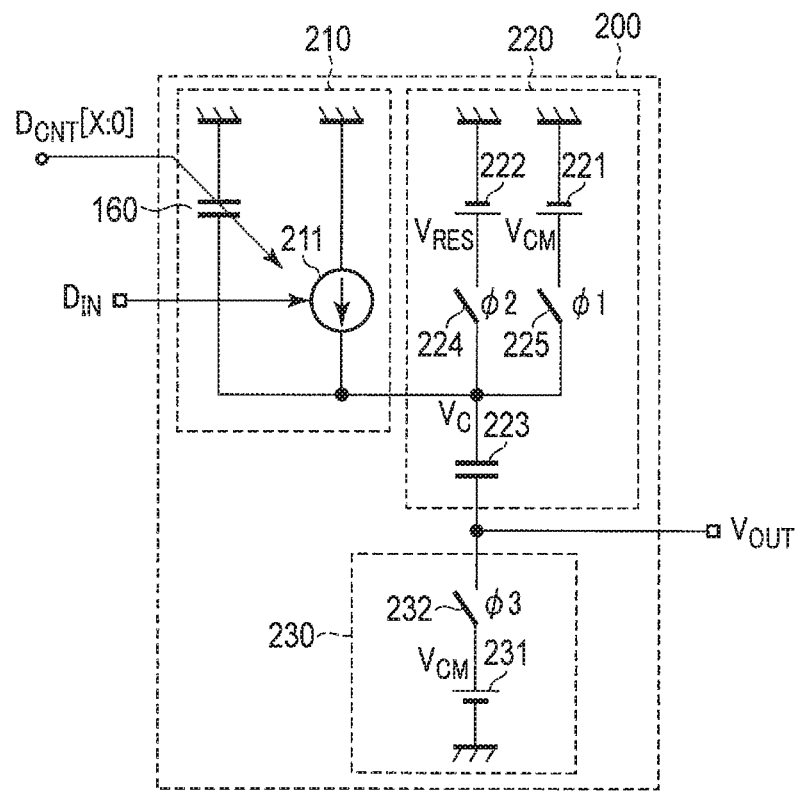
F I G. 14
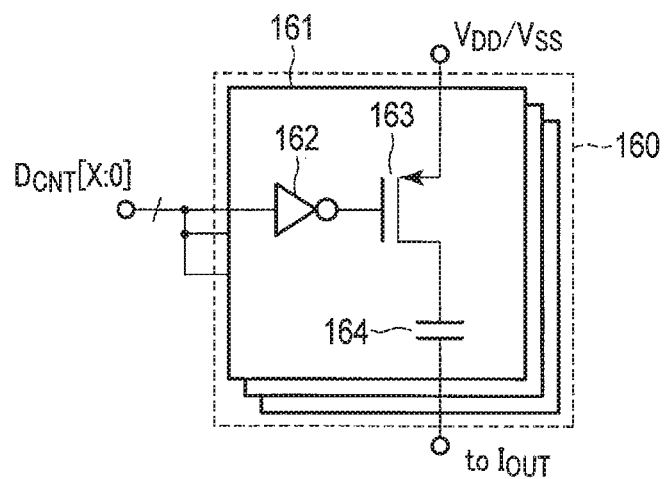
F I G. 15

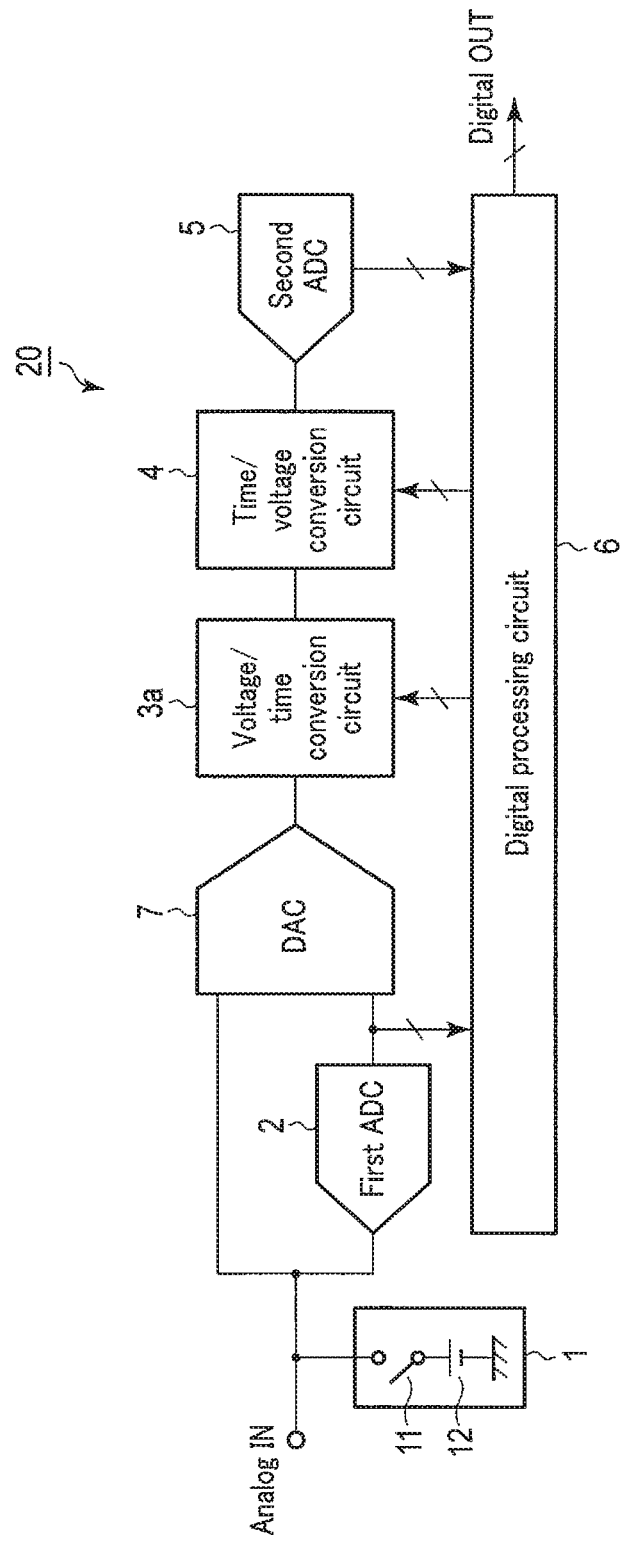
F I G. 16

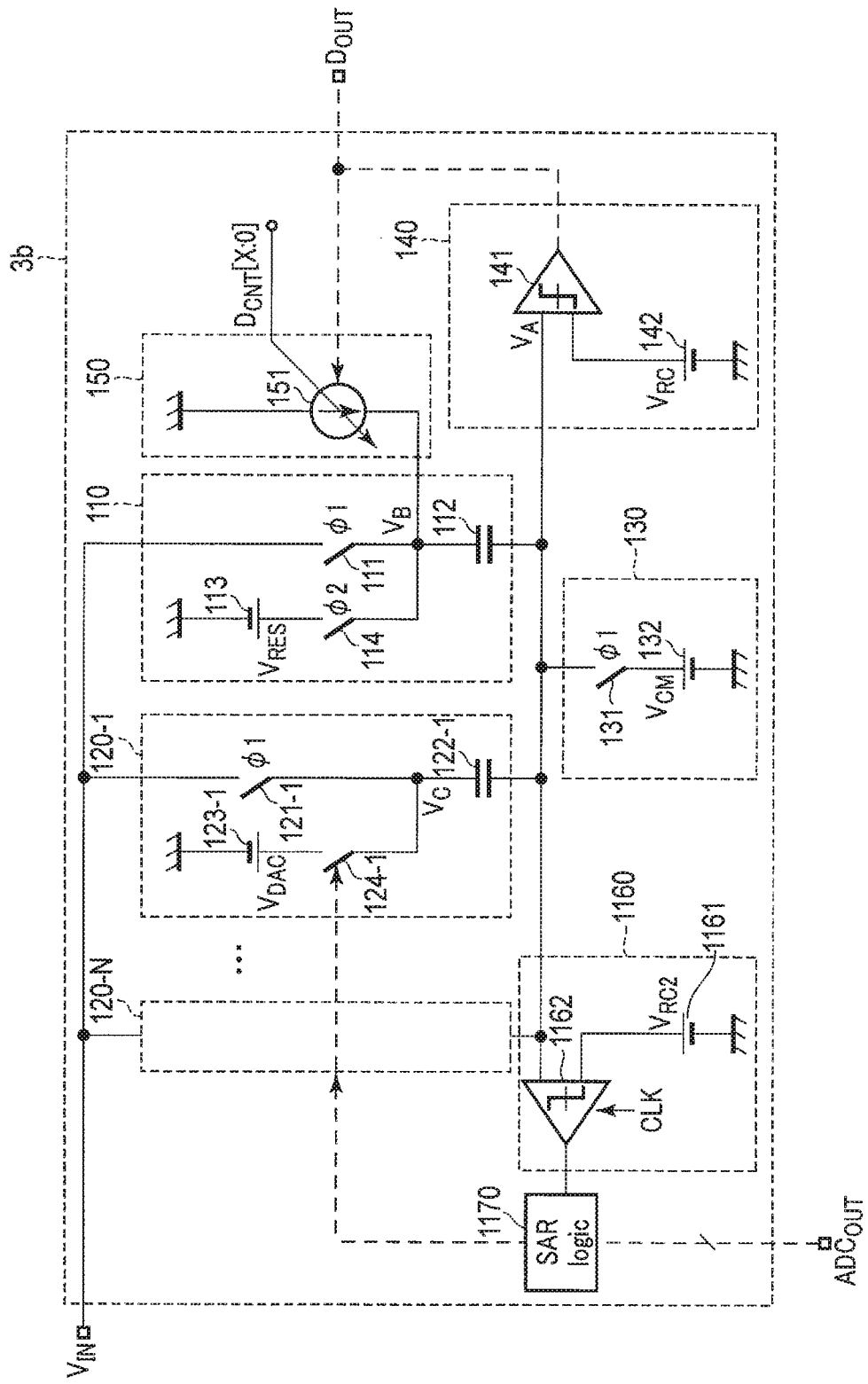
F I G. 18

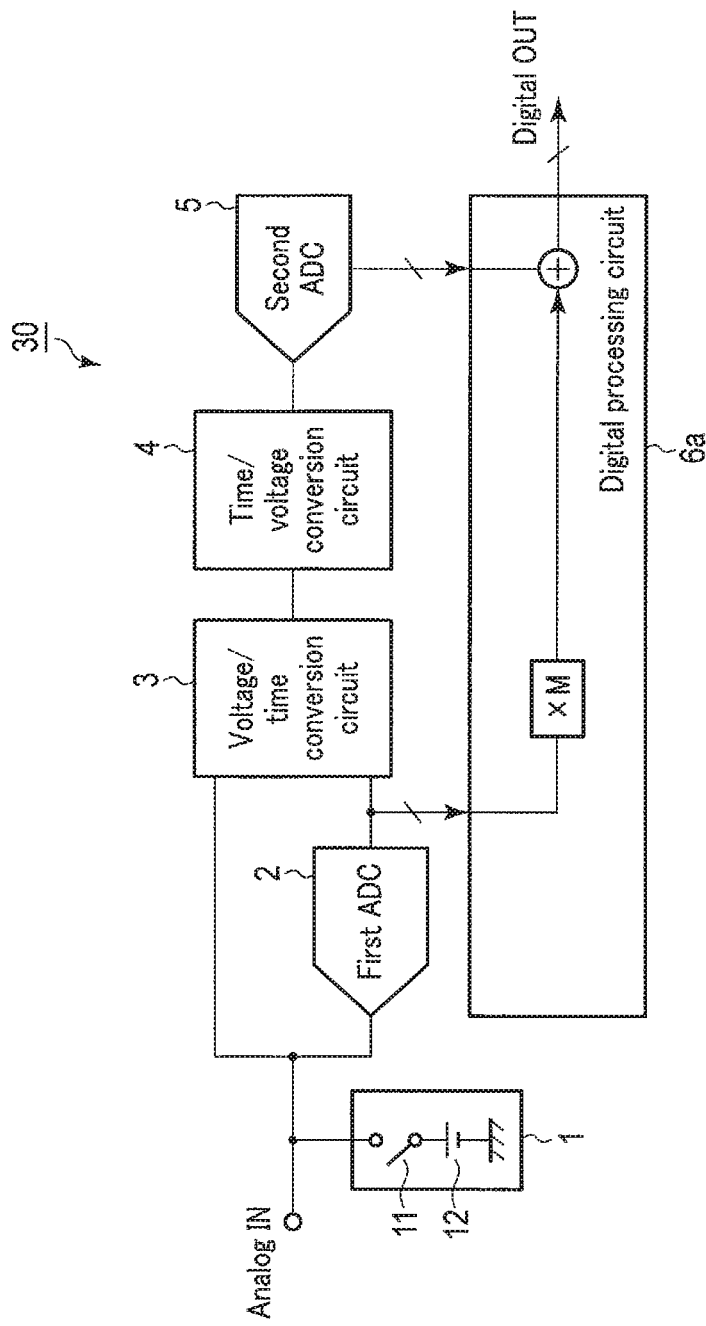
F I G. 19

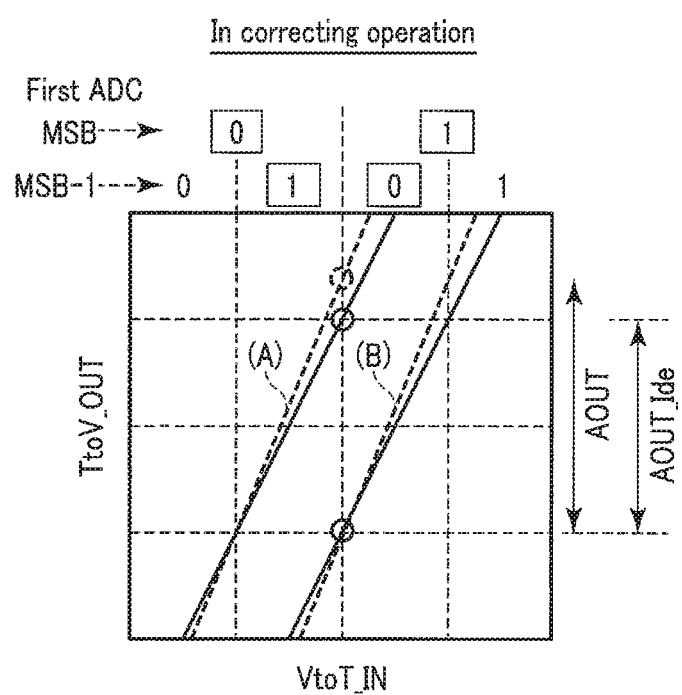
F I G. 20

ANALOG/DIGITAL CONVERSION CIRCUIT

CROSS-REFERENCE TO RELATED APPLICATIONS

This application is based upon and claims the benefit of priority from the Japanese Patent Application No. 2015-052693, filed Mar. 16, 2015, the entire contents of which are incorporated herein by reference.

FIELD

Embodiments described herein relate generally to an analog/digital conversion circuit that converts an analog signal into a digital signal.

BACKGROUND

An analog/digital conversion circuit (hereinafter also referred to as an AD conversion circuit) that converts an analog signal into a digital signal (hereinafter referred to as analog/digital conversion) generally has an amplification circuit that performs an amplifying operation.

However, this amplification circuit cannot provide a desired value as a gain in the amplifying operation due to a parasitic capacitance generated in the circuit or production variations, and deteriorates an accuracy of the AD conversion circuit in some cases.

BRIEF DESCRIPTION OF THE DRAWINGS

FIG. 1 is a block diagram showing a configuration of an AD conversion circuit according to a first embodiment;

FIG. 2A is a circuit diagram showing a configuration of a voltage/time conversion circuit in the AD conversion circuit according to the first embodiment;

FIG. 3 is a timing chart showing changes in various signals in each phase provided by dividing an operation of the voltage/time conversion circuit;

FIG. 4 is a circuit diagram showing a configuration of a time/voltage conversion circuit in the AD conversion circuit according to the first embodiment;

FIG. 7 is a circuit diagram of a variable current section of the current source depicted in FIG. 6;

FIG. 8 is a circuit diagram showing another structural example of the current source in each of the voltage/time conversion circuit and the time/voltage conversion circuit according to the first embodiment;

FIG. 12 is a flowchart showing another correcting operation in the AD conversion circuit according to the first embodiment;

FIG. 14 is a circuit diagram showing a configuration of a time/voltage conversion circuit in the AD conversion circuit according to the second embodiment;

FIG. 15 is a circuit diagram of a variable capacitor in each of the voltage/time conversion circuit and the time/voltage conversion circuit in the second embodiment;

FIG. 16 is a block diagram showing a configuration of an AD conversion circuit according to a third embodiment;

FIG. 18 is a circuit diagram showing a configuration of a voltage/time conversion circuit according to a modification;

FIG. 19 is a block diagram showing a configuration of an AD conversion circuit according to a fourth embodiment;

FIG. 20 is a view showing input/output characteristics of a voltage/time conversion circuit and a time/voltage conversion circuit in a correcting operation according to the fourth embodiment.

DETAILED DESCRIPTION

Figure 2B:
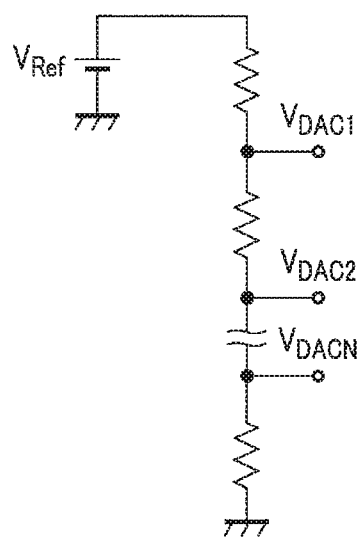
FIG. 2B is a circuit diagram showing a configuration of a ladder resistor in the voltage/time conversion circuit.

Embodiments will now be described hereinafter with reference to the drawings. It is to be noted that, in the following description, constituent elements having the same functions and configurations are denoted by like reference signs.

In general, according to one embodiment, an analog/digital conversion circuit includes a setting circuit, a first analog/digital converter, a voltage/time conversion circuit, a time/voltage conversion circuit, a second analog/digital converter and a digital processing circuit. The setting circuit fixes an input to a first voltage. The first analog/digital converter converts the first voltage into a first digital signal. The voltage/time conversion circuit includes a first capacitor and a first current source which supplies an electric current to the first capacitor. The voltage/time conversion circuit acquires a residual signal corresponding to a difference between the first voltage and a result of having converted the first digital signal into an analog signal, and converts the residual signal into a time signal in accordance with a voltage charged in the first capacitor. The time/voltage conversion circuit includes a second capacitor and a second current source which supplies an electric current to the second capacitor. The time/voltage conversion circuit converts the time signal into a voltage signal in accordance with a voltage charged in the second capacitor. The second analog/digital converter converts the voltage signal into a second digital signal. The digital processing circuit outputs a third digital signal to adjust a current value of at least one of the first current source and the second current source based on the second digital signal.

First Embodiment

An analog/digital conversion circuit (an AD conversion circuit) according to a first embodiment will now be described.

1. Configuration of AD Conversion Circuit

FIG. 1 is a block diagram showing a configuration of an AD conversion circuit according to the first embodiment. As shown in the drawing, an AD conversion circuit 10 includes a setting circuit 1, a first analog/digital converter (ADC) 2, a voltage/time conversion circuit 3, a time/voltage conversion circuit 4, a second analog/digital converter (ADC) 5, and a digital processing circuit 6. The AD conversion circuit 10 includes a normal operation and a correcting operation. The normal operation is an operation to convert an input analog signal into a digital signal. The correcting operation is an operation to correct accuracy deterioration of analog/digital conversion in the AD conversion circuit.

An outline of the operations of the AD conversion circuit according to the first embodiment will be described hereinafter.

The first analog/digital converter (ADC) 2 performs the analog/digital conversion to a part of an input signal to generate a first digital signal. The first analog/digital converter 2 outputs the first digital signal to the digital processing circuit 6. The voltage/time conversion circuit 3 substantially performs voltage/time conversion to a remaining part (a residual signal) of the input signal to provide a time signal. The voltage/time conversion circuit 3 outputs the time signal, to the time/voltage conversion circuit 4.

Specifically, the first analog/digital converter 2 carries out the analog/digital conversion to a part of the input signal to provide the first digital signal. The first analog/digital converter 2 outputs the first digital signal to the voltage/time conversion circuit 3 and the digital processing circuit 6.

The voltage/time conversion circuit 3 has a digital/analog converting function, and performs digital/analog conversion to the first digital signal to provide a first analog signal. The voltage/time conversion circuit 3 carries out the voltage/time conversion to the input signal. However, the voltage/time conversion circuit 3 controls a later-described adjustment voltage $V_{DAC}$ by using the first analog signal ($DAC_{IN}$). Thus, the voltage/time conversion circuit 3 substantially carries out the voltage/time conversion to the residual signal corresponding to a difference between the input signal and the first analog signal to provide the time signal. Here, the voltage/time conversion circuit 3 has a first capacitor and a first current source that supplies an electric current to the first capacitor, and converts the residual signal into the time signal in accordance with a voltage charged in the first capacitor. The voltage/time conversion circuit 3 outputs the time signal to the time/voltage conversion circuit 4.

The time/voltage conversion circuit 4 restores the residual signal by performing the time/voltage conversion to the time signal. In other words, the time/voltage conversion circuit 4 has a second capacitor and a second current source that supplies an electric current to the second capacitor, and converts the time signal into a voltage signal in accordance with a voltage charged in the second capacitor. The time/voltage conversion circuit 4 outputs the restored residual signal, to the second analog/digital converter 5.

The second analog/digital converter 5 carries out the analog/digital conversion to the restored residual signal to provide a second digital signal. The second analog/digital converter 5 outputs the second digital signal to the digital processing circuit 6.

The digital processing circuit 6 outputs a third digital signal that adjusts a current value of at least one of the first current source and the second current source based on the second digital signal.

1.1 Setting Circuit and First Analog/Digital Converter

The setting circuit 1 includes a switch 11 and a voltage source 12. The setting circuit 1 fixes a first voltage, with which the voltage source 12 supplies the input signal, to, e.g., an "H (High)" level at the time of the correcting operation. The first analog/digital converter 2 performs the analog/digital conversion to the first voltage and outputs the first digital signal.

1.2 Voltage/Time Conversion Circuit

The voltage/time conversion circuit 3 is a circuit that converts the voltage signal into the time signal (hereinafter referred to as voltage/time conversion), and it executes addition/subtraction to the input signal and a result of converting the first digital signal output from the first analog/digital converter 2 into the analog signal. The voltage/time conversion circuit 3 has a function to adjust a current value of a current source in the voltage/time conversion circuit 3 based on a digital control signal $D_{CNT}[X:0]$ output from the later-described digital processing circuit 6.

The voltage/time conversion circuit 3 will now be described with reference to FIG. 2A, FIG. 2A is a circuit diagram showing a configuration of the voltage/time conversion circuit 3.

The voltage/time conversion circuit 3 generates the time signal by performing the voltage/time conversion to the input signal. The time signal represents a time length that is dependent on a voltage of the input signal (hereinafter referred to as an input voltage $V_{IN}$). The time signal is, e.g., a rectangular wave signal having a pulse width that varies in proportion to the input voltage $V_{IN}$. The voltage/time conversion circuit 3 outputs the time signal to the time/voltage conversion circuit 4.

The voltage/time conversion circuit 3 includes a first sampling circuit 110, second sampling circuits 120-1, ..., 120-N, a bottom plate sampler 130, a detector 140, and a signal generator 150. Here, for simplicity's sake, a description will be given as to an example where a single second sampling circuit 120-1 is provided as the second sampling circuit.

The first sampling circuit 110 includes a switch 111, a sampling capacitance (a capacitor) 112, a voltage source 113, and a switch 114. The first sampling circuit 110 has a first terminal, a second terminal, and a third terminal. The sampling capacitance 112 has a first terminal and a second terminal. The voltage source 113 has a positive electrode terminal and a negative electrode terminal.

The switch 111 is interposed between the first terminal of the first sampling circuit 110 and the first terminal of the sampling capacitance 112. The switch 111 performs short-circuiting or open-circuiting between the first terminal of the first sampling circuit 110 and the first terminal of the sampling capacitance 112 in accordance with a first switch control signal (φ1).

Specifically, in a sample phase of the voltage/time conversion circuit 3, the switch 111 performs short-circuiting between the first terminal of the first sampling circuit 110 and the first terminal of the sampling capacitance 112. On the other hand, in a reset phase and a conversion phase of the voltage/time conversion circuit 3, the switch 111 performs open-circuiting between the first terminal of the first sampling circuit 110 and the first terminal of the sampling capacitance 112.

The first terminal of the sampling capacitance 112 is connected to the third terminal of the first sampling circuit 110, the switch 111, and the switch 114 in common. The second terminal of the sampling capacitance 112 is connected to the second terminal of the first sampling circuit 110. A capacitance of the sampling capacitance 112 is determined as $C_1$.

The positive electrode terminal of the voltage source 113 is connected to the switch 114. The negative electrode terminal of the voltage source 113 is grounded. The voltage source 113 generates a reset voltage $V_{RES}$.

The switch 114 is interposed between the first terminal of the sampling capacitance 112 and the positive electrode terminal of the voltage source 113. The switch 114 performs short-circuiting or open-circuiting between the first terminal of the sampling capacitance 112 and the positive electrode terminal of the voltage source 113 in accordance with a second switch control signal ($\phi 2$).

Specifically, in the reset phase of the voltage/time conversion circuit 3, the switch 114 performs short-circuiting between the first terminal of the sampling capacitance 112 and the positive electrode terminal of the voltage source 113. On the other hand, in the sample phase and the conversion phase of the voltage/time conversion circuit 3, the switch 114 performs open-circuiting between the first terminal of the sampling capacitance 112 and the positive electrode terminal of the voltage source 113.

The second sampling circuit 120-1 includes a switch 121-1, a sampling capacitance 122-1, a voltage source 123-1, and a switch 124-1. The second sampling circuit 120-1 has a first terminal, a second terminal, and a third terminal. The sampling capacitance 122-1, has a first terminal and a second terminal. The voltage source 123-1 has a positive electrode terminal and a negative electrode terminal.

The switch 121-1 is interposed between the first terminal of the second sampling circuit 120-1 and the first terminal of the sampling capacitance 122-1. The switch 121-1 performs short-circuiting or open-circuiting between the first terminal of the second sampling circuit 120-1 and the first terminal of the sampling capacitance 122-1 in accordance with the first switch control signal ($\phi 1$).

Specifically, in the sample phase of the voltage/time conversion circuit 3, the switch 121-1 performs short-circuiting between the first terminal of the second sampling circuit 120-1 and the first terminal of the sampling capacitance 122-1. On the other hand, in the reset phase and the conversion phase of the voltage/time conversion circuit 3, the switch 121-1 performs 124-1 open-circuiting between the first terminal of the second sampling circuit 120-1 and the first terminal of the sampling capacitance 122-1.

The first terminal of the sampling capacitance 122-1 is connected to the switch 121-1 and the switch 124-1 in common. The second terminal of the sampling capacitance 122-1 is connected to the second terminal of the second sampling circuit 120-1. A capacitance of the sampling capacitance 122-1 is determined as $C_1$.

The positive electrode terminal of the voltage source 123-1 is connected to the switch 124-1. The negative electrode terminal of the voltage source 123-1 is grounded. The voltage source 123-1 generates an adjustment voltage $V_{DAC}$. This voltage $V_{DAC}$ may be controlled by a control signal that is not shown in FIG. 2A.

The switch 124-1 is interposed between the first terminal of the sampling capacitance 122-1 and the positive electrode terminal of the voltage source 123-1. The switch 124-1 performs short-circuiting or open-circuiting between the first terminal of the sampling capacitance 122-1 and the positive electrode terminal of the voltage source 123-1 in accordance with a third switch control signal ($\phi 3$). As to the third switch control signal ($\phi 3$), for example, an output ($DAC_{IN}$) from the analog/digital converter 2 corresponds to this signal, and the switch 124-1 performs short-circuiting or open-circuiting between the first terminal of the sampling capacitance 122-1 and the positive electrode terminal of the voltage source 123-1 in accordance with the output ($DAC_{IN}$) from the analog/digital converter 2.

Specifically, in the reset phase and the conversion phase of the voltage/time conversion circuit 3, the switch 124-1 performs short-circuiting between the first terminal of the sampling capacitance 122-1 and the positive electrode terminal of the voltage source 123-1. On the other hand, in the sample phase of the voltage/time conversion circuit 3, the switch 124-1 performs open-circuiting between the first terminal of the sampling capacitance 122-1 and the positive electrode terminal of the voltage source 123-1.

In the case of supplying different voltages by the second sampling circuits 120-1 to 120-N, the adjustment voltage $V_{DAC}$ shown in FIG. 2A can be realized by using voltages $V_{DAC1}$ to $V_{DACN}$ generated by a ladder resistor as shown in FIG. 2B. A switch corresponding to the switch 124-1 in FIG. 2A is connected to an output terminal of each voltage $V_{DAC}$ to perform, short-circuiting or open-circuiting between the output terminal of each voltage $V_{DAC}$ and the sampling capacitances 122-1 to 122-N. In this case, adjustment voltages $V_{DAC1}$ to $V_{DACN}$ can be generated by one of reference voltages Vref.

The bottom plate sampler 130 includes a switch 131 and a voltage source 132. The bottom plate sampler 130 has a first terminal. The voltage source 132 has a positive electrode terminal and a negative electrode terminal.

The switch 131 is interposed between the first terminal of the bottom plate sampler 130 and the positive electrode terminal of the voltage source 132. The switch 131 performs short-circuiting or open-circuiting between the first terminal of the bottom plate sampler 130 and the positive electrode terminal of the voltage source 132 in accordance with the first switch control signal ($\phi 1$).

Specifically, in the sample phase of the voltage/time conversion circuit 3, the switch 131 performs short-circuiting between the first terminal of the bottom plate sampler 130 and the positive electrode terminal of the voltage source 132. On the other hand, in the reset phase and the conversion phase of the voltage/time conversion circuit 3, the switch 131 performs open-circuiting between the first terminal of the bottom plate sampler 130 and the positive electrode terminal of the voltage source 132.

The positive electrode terminal of the voltage source 132 is connected to the switch 131. The negative electrode terminal of the voltage source 132 is grounded. The voltage source 132 generates an intermediate voltage $V_{CM}$. The intermediate voltage $V_{CM}$ may be designed to coincide with a common mode voltage if the voltage/time conversion circuit 3 has a differential configuration.

The detector 140 includes a comparator 141 and a voltage source 142.

The comparator 141 includes a first input terminal, a second input terminal, and an output terminal. The first input terminal of the comparator 141 is connected to the input terminal of the detector 140. The second input terminal of the comparator 141 is connected to the positive electrode terminal of the voltage source 142. The output terminal of the comparator 141 is connected to the output terminal of the detector 140.

In the conversion phase of the voltage/time conversion circuit 3, the comparator 141 compares a voltage at the first input terminal with a voltage at the second input terminal.

The comparator 141 stops operations in the sample phase and the reset phase of the voltage/time conversion circuit 3.

Specifically, in the conversion phase of the voltage/time conversion circuit 3, if the voltage at the first input terminal is smaller than the voltage at the second input terminal, the comparator 141 outputs a time signal $D_{OUT}$ on an "H" level (a power supply voltage). On the other hand, if the voltage at the first input terminal is not smaller than the voltage at the second input terminal, the comparator 141 outputs the time signal $D_{OUT}$ on an "L" level (a ground voltage).

The voltage source 142 has a positive electrode terminal and a negative electrode terminal. The positive electrode terminal of the voltage source 142 is connected to the second input terminal of the comparator 141. The negative electrode terminal of the voltage source 142 is grounded. The voltage source 142 generates a comparative reference voltage $V_{RC}$.

The signal generator 150 includes a current source 151.

The current source 151 includes a first terminal, a second terminal, a current adjustment terminal, and a control terminal. The first terminal of the current source 151 is grounded. The second terminal of the current source 151 is connected to an output terminal of the signal generator 150. The control terminal of the current source 151 is connected to a control terminal of the signal generator 150. The current adjustment terminal is a terminal to adjust an amount of an electric current of the current source 151. A digital control signal $D_{CNT}[X:0]$ is input to the current adjustment terminal from the analog processing circuit 6.

The current source 151 receives the time signal $D_{OUT}$ from the detector 140 through the control terminal. If the time signal $D_{OUT}$ is on the "H" level, the current source 151 generates a constant current signal, and supplies the constant current signal to the first sampling circuit 110 through the second terminal. On the other hand, if the time signal $D_{OUT}$ is on the "L" level, the current source 151 stops the operations.

As described above, the operations of the voltage/time conversion circuit 3 are sorted based on the sample phase, the reset phase, and the conversion phase. Further, the various switch control signals, time signals, and voltages in various nodes vary as illustrated in FIG. 3.

In the sample phase, the first switch control signal (φ1) is on the "H" level, the second switch control signal (φ2) is on the "L" level, and the third switch control signal (φ3) is on the "L" level. Furthermore, in the sample phase, the detector 140 does not operate. That is, in the sample phase, the voltage/time conversion circuit 3 charges the sampling capacitance 112 and the sampling capacitance 122-1 with a differential voltage of the input voltage $V_{IN}$ of the voltage/time conversion circuit 3 and the intermediate voltage $V_{CM}$.

In the reset phase, the first switch control signal (φ1) is on the "L" level, the second switch control signal (φ2) is on the "H" level, and the third switch control signal (φ3) is on the "H" level. Furthermore, in the reset phase, the detector 140 does not operate. That is, in the reset phase, the voltage/time conversion circuit 3 resets a voltage at the first terminal of the sampling capacitance 112 by using the reset voltage $V_{RES}$, and fixes a voltage at the first terminal of the sampling capacitance 122-1 by using the adjustment voltage $V_{DAC}$.

Here, a voltage $V_{A\_RES}$ in the reset phase of a node having the same potential as that at the input terminal of the detector 140 (referred to as a node A in the following description) can be derived as follows.

At the end of the sample phase, an electric charge of $C_1 \cdot (V_{IN} - V_{CM})$ is stored in each of the sampling capacitance 112 and the sampling capacitance 122-1. According to the charge conservation, in the sample phase, a total amount of electric charges ($2C_1 \cdot (V_{IN} - V_{CM})$) stored in the sampling capacitance 112 and the sampling capacitance 122-1 does not change in the reset phase. Therefore, the following Expression (1) can be achieved.

$$V_{A\_RES} = -V_{IN} + V_{CM} + \frac{V_{RES} + V_{DAC}}{2} \qquad (1)$$

Here, assuming that the input voltage $V_{IN}$ consists of a direct-current component and an alternating-current component and the alternating-current component is $V_{INAC}$, when the intermediate voltage $V_{CM}$ is designed to coincide with the direct-current component, the following Expression (2) can be achieved.

$$V_{A\_RES} = -V_{INAC} + \frac{V_{RES} + V_{DAC}}{2} \qquad (2)$$

In the conversion phase, the first switch control signal (φ1) is on the "L" level, the second control signal (φ2) is on the "L" level, and the third switch control signal (φ3) is on the "H" level. Moreover, in the conversion phase, the detector 140 operates. That is, in the conversion phase, the voltage/time conversion circuit 3 disconnects the first terminal of the sampling capacitance 112 from the voltage source 113. The comparator 141 detects whether a voltage $V_A$ at the node A is less than the comparative reference voltage $V_{RC}$, and outputs the time signal $D_{OUT}$ on the "H" level over a first period in which $V_A < V_{RC}$ is achieved. In addition, it is assumed that the reset voltage $V_{RES}$, the voltage $V_{DAC}$, and the comparative reference voltage $V_{RC}$ are determined so that $V_A < V_{RC}$ can be achieved at the start of the conversion phase.

The current source 151 supplies the constant current signal to the first terminal of the sampling capacitance 112 over the first period. Since the sampling capacitance 112 and the sampling capacitance 122-1 are connected in series as seen from the current source 151, this constant current signal charges the sampling capacitance 112 and the sampling capacitance 122-1. Thus, the voltage $V_A$ at the node A rises with time, and coincides with the comparative reference voltage $V_{RC}$ eventually (at the end of the first period).

As seen from the current source 151, the sampling capacitance 112 and the sampling capacitance 122-1 are connected in series, and a voltage $V_B$ at a node having the same potential as that at the first terminal of the sampling capacitance 112 (referred to as node B in the following description) is equal to $V_{RES}$ at the start of the conversion phase. Thus, a voltage $V_{B\_CNV}$ at the node B at the end of the first period can be calculated by using the following Expression (3).

$$V_{B\_CNV} = \frac{1}{C_1/2} \int_0^{T_{DOUT}} I_{151} \, dt + V_{RES} \qquad (3)$$
$$= 2 \cdot \frac{I_{151} \cdot T_{DOUT}}{C_1} + V_{RES}$$

In Expression (3), $T_{DOUT}$ represents a time length of the first period, and $I_{151}$ represents an amount of an electric current the constant current signal supplied by the current source 151 has.

Additionally, considering voltage division performed by the sampling capacitance 112 and the sampling capacitance 122-1, an increment of the voltage $V_A$ at the node A in the first period coincides with a half of an increment of the voltage at the node B in the first period. Further, the voltage $V_A$ at the node A at the start of the conversion phase is equal to the voltage $V_{A\_RES}$. Thus, a voltage $V_{A\_CNV}$ at the node A at the end of the first period can be calculated by using the following Expression (4).

$$V_{A\_CNV} = \frac{I_{151} \cdot T_{DOUT}}{C_1} + V_{A\_RES} \quad (4)$$

As described above, at the end of the first period, the voltage $V_A$ at the node A coincides with the comparative reference voltage $V_{RC}$. Thus, the time length $T_{DOUT}$ of the first period can be derived by using the following Expression (5) and Expression (6)

$$V_{A\_CNV} = V_{RC} \quad (5)$$
$$\frac{I_{151} \cdot T_{DOUT}}{C_1} + V_{A\_RES} = V_{RC}$$

$$T_{DOUT} = \frac{C_1}{I_{151}}\left(V_{INAC} + V_{RC} - \frac{V_{RES} + V_{DAC}}{2}\right) \quad (6)$$

As can be understood from Expression (6), the time length $T_{DOUT}$ of the first period is proportionate to a sum of an alternating-current component $V_{INAC}$, a residual of $V_{DAC}/2$ and a direct-current component in the input voltage $V_{IN}$. That is, the time signal $D_{OUT}$ represents the time length $T_{DOUT}$ that is dependent on the input voltage $V_{IN}$.

A proportionality coefficient can be set to a desired value by appropriately designing $I_{151}$ and $C_1$. Each direct-current component can be set to a desired value by appropriately setting $V_{RC}$, $V_{RES}$, and $V_{DAC}$.

1.3 Time/Voltage Conversion Circuit

The time/voltage conversion circuit 4 is a circuit that converts a time signal into a voltage signal (hereinafter referred to as time/voltage conversion), and it adds or subtracts a result of converting a signal output from the voltage/time conversion circuit 3 into an analog signal. The time/voltage conversion circuit 4 has a function to adjust a current value of a current source in the time/voltage conversion circuit 4 based on the digital control signal. $D_{CNT}$[X:0] output from the later-described digital processing circuit 6.

The time/voltage conversion circuit 4 will now be described with reference to FIG. 4. FIG. 4 is a circuit diagram showing a configuration of the time/voltage conversion circuit 4.

The time/voltage conversion circuit 4 includes a signal generator 210, a third sampling circuit 220, and a bottom plate sampler 230.

The signal generator 210 includes a current source 211.

The current source 211 includes a first terminal, a second terminal, a current adjustment terminal, and a control terminal. The first terminal of the current source 211 is grounded. The second terminal of the current source 211 is connected to an output terminal of the signal generator 210. A time signal $D_{IN}$ is input to the control terminal of the current source 211. The current adjustment terminal is a terminal to adjust an amount of an electric current of the current source 211. The digital control signal $D_{CNT}$[X:0] is input to the current adjustment terminal from the analog processing circuit 6.

The current source 211 receives the time signal $D_{IN}$ from the voltage/time conversion circuit 3. If the time signal $D_{IN}$ is on the "H" level, the current source 211 generates a constant current signal, and supplies the constant current signal to the third sampling circuit 220. On the other hand, if the time signal $D_{IN}$ is on the "L" level, the current source 211 stops the operations.

The third sampling circuit 220 includes a voltage source 221, a voltage source 222, a sampling capacitance 223, a switch 224, and a switch 225.

The voltage source 221 has a positive electrode terminal and a negative electrode terminal. The positive electrode terminal of the voltage source 221 is connected to the switch 225. The negative electrode terminal of the voltage source 221 is grounded. The voltage source 221 generates an intermediate voltage $V_{CM}$.

The voltage source 222 has a positive electrode terminal and a negative electrode terminal. The positive electrode terminal of the voltage source 222 is connected to the switch 224. The negative electrode terminal of the voltage source 222 is grounded. The voltage source 222 generates a reset voltage $V_{RES}$.

The sampling capacitance 223 has a first terminal and a second terminal. The first terminal of the sampling capacitance is connected to an output terminal of the current source 211, the switch 224, and the switch 225 in common. The second terminal of the sampling capacitance 223 is connected to an output terminal of the time/voltage conversion circuit 4 and the switch 232.

A capacitance of the sampling capacitance 223 is assumed to be $C_2$. $C_2$ is typically designed to coincide with a constant multiple of $C_1$. This constant multiple may be, e.g., an inverse number of a gain (an amplification factor) of an amplification circuit including the voltage/time conversion circuit 3 and the time/voltage conversion circuit 4. For example, if the gain is double, approximately $C_2=C_1/2$ can be set.

The switch 224 is interposed between the first terminal of the sampling capacitance 223 and the positive electrode terminal of the voltage source 222. The switch 224 performs short-circuiting or open-circuiting between the first terminal of the sampling capacitance 223 and the positive electrode terminal of the voltage source 222 in accordance with the second switch control signal (ϕ2).

Specifically, in a reset phase of the time/voltage conversion circuit 4, the switch 224 performs short-circuiting between the first terminal of the sampling capacitance 223 and the positive electrode terminal of the voltage source 222. On the other hand, in a sample phase and a hold phase of the time/voltage conversion circuit 4, the switch 224 performs open-circuiting between the first terminal of the sampling capacitance 223 and the positive electrode terminal of the voltage source 222.

The switch 225 is interposed between the first terminal of the sampling capacitance 223 and the positive electrode terminal of the voltage source 221. The switch 225 performs short-circuiting or open-circuiting between the first terminal of the sampling capacitance 223 and the positive electrode terminal of the voltage source 221 in accordance with the first switch control signal (ϕ1).

Specifically, in the hold phase of the time/voltage conversion circuit 4, the switch 225 performs short-circuiting between the first terminal of the sampling capacitance 223 and the positive electrode terminal of the voltage source 221. On the other hand, in the reset phase and the sample phase of the time/voltage conversion circuit 4, the switch 225 performs open-circuiting between the first terminal of the sampling capacitance 223 and the positive electrode terminal of the voltage source 221.

The bottom plate sampler 230 includes a voltage source 231 and a switch 232.

The voltage source 231 has a positive electrode terminal and a negative electrode terminal. The positive electrode terminal of the voltage source 231 is connected to the switch 232. The negative electrode terminal of the voltage source 231 is grounded. The voltage source 231 generates the intermediate voltage $V_{CM}$.

The switch 232 is interposed between the first terminal of the bottom plate sampler 230 and the positive electrode terminal of the voltage source 231. The switch 232 performs short-circuiting or open-circuiting between the first terminal of the bottom plate sampler 230 and the positive electrode terminal of the voltage source 231 in accordance with the third switch control signal ($\phi 3$).

Specifically, in the reset phase and the sample phase of the time/voltage conversion circuit 4, the switch 232 performs short-circuiting between the first terminal of the bottom plate sampler 230 and the positive electrode terminal of the voltage source 231. On the other hand, in the hold phase of the time/voltage conversion circuit 4, the switch 232 performs open-circuiting between the first terminal of the bottom plate sampler 230 and the positive electrode terminal of the voltage source 231.

Figure 5:
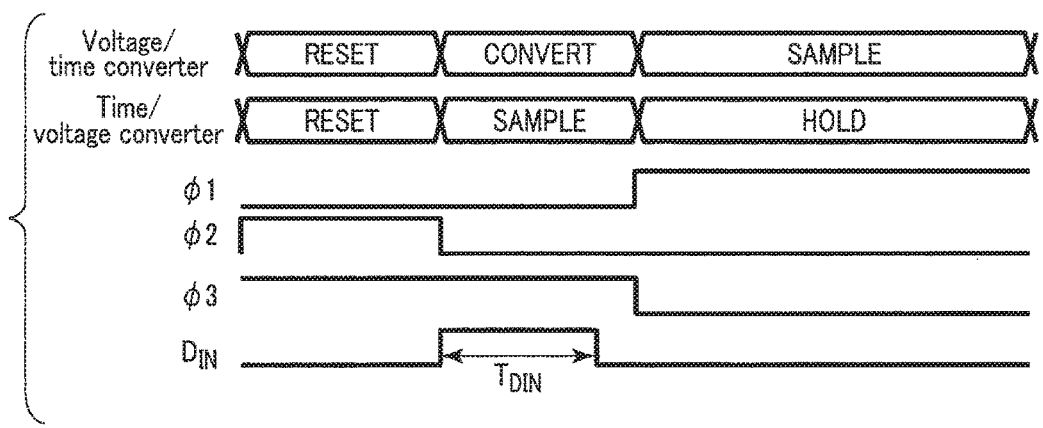
FIG. 5 is a timing chart showing changes in various signals in each phase provided by dividing an operation of the time/voltage conversion circuit.

As described above, the operations of the time/voltage conversion circuit 4 are sorted based on the reset phase, the sample phase, and the hold phase. Further, the various switch control signals and time signals vary as illustrated in FIG. 5.

In the reset phase, the first switch control signal ($\phi 1$) is on the "L" level, the second switch control signal ($\phi 2$) is on the "H" level, and the third switch control signal ($\phi 3$) is on the "H" level. The reset phase of the time/voltage conversion circuit 4 is matched with the reset phase of the voltage/time conversion circuit 3 in terms of time.

That is, in the reset phase, the time/voltage conversion circuit 4 resets a voltage at the first terminal of the sampling capacitance 223 by using the reset voltage $V_{RES}$, and fixes a voltage at the second terminal of the sampling capacitance 223 by using the intermediate voltage $V_{CM}$.

In the sample phase, the first switch control signal ($\phi 1$) is on the "L" level, the second switch control signal ($\phi 2$) is on the "L" level, and the third switch control signal ($\phi 3$) is on the "H" level. The sample phase of the time/voltage conversion circuit 4 is matched with the conversion phase of the voltage/time conversion circuit 3 in terms of time.

That is, in the sample phase, the time/voltage conversion circuit 4 disconnects the first terminal of the sampling capacitance 223 from the voltage source 222. Since the current source 211 receives the time signal $D_{IN}$ on the "H" level over the first period, it supplies the constant current signal to the third sampling circuit 220 over the first period. This constant current signal flows through a current path formed by the sampling capacitance 223, the switch 232, and the voltage source 231. Since this constant current signal charges the sampling capacitance 223, the voltage at the first terminal of the sampling capacitance 223 rises with time.

A voltage $V_C$ at a node having the same potential as that at the first terminal of the sampling capacitance 223 (which will be referred to as a node C in the following description) is equal to $V_{RES}$ at the start of the sample phase. Thus, a voltage $V_{C\_SMP}$ at the node C at the end of the first period can be calculated by using the following Expression (7).

$$V_{C\_SMP} = \frac{1}{C_2}\int_0^{T_{DIN}} I_{211}\, dt + V_{RES} \qquad (7)$$
$$= \frac{I_{211} \cdot T_{DIN}}{C_2} + V_{RES}$$

In Expression (7), $T_{DIN}$ represents a time length of the first period, and $I_{211}$ represents an amount of an electric current the constant current signal supplied by the current source 211 has.

In the hold phase, the first switch control signal ($\phi 1$) is on the "H" level, the second control signal ($\phi 2$) is on the "L" level, and the third switch control signal ($\phi 3$) is on the "L" level. The hold phase of the time/voltage conversion circuit 4 is matched with the sample phase of the voltage/time conversion circuit 3 in terms of time.

In the hold phase, the time/voltage conversion circuit 4 fixes a voltage at the first terminal of the sampling capacitance 223 by using the intermediate voltage $V_{CM}$, and disconnects the second terminal of the sampling capacitance 223 from the voltage source 231.

At the end of the sample phase, the sampling capacitance 223 has an electric charge of $C_2 \cdot (V_{C\_SMP} - V_{CM})$ stored therein. According to the charge conservation, in the sample phase, a total amount of electric charges stored in the sampling capacitance 223 does not change in the hold phase. Therefore, the following Expression (8) can be achieved in regard to an output voltage $V_{OUT}$ of the time/voltage conversion circuit 4.

$$V_{OUT} = \frac{I_{211}T_{DIN}}{C_2} - V_{RES} + 2V_{CM} \qquad (8)$$

Assuming that $T_{DIN}$ in Expression (8) coincides with $T_{DOUT}$ shown in Expression (6), Expression (8) can be rewritten with the following Expression (9).

$$V_{OUT} = \frac{I_{211}}{C_2} \cdot \frac{C_1}{I_{151}}\left(V_{INAC} + V_{RC} - \frac{V_{RES} + V_{DAC}}{2}\right) - V_{RES} + 2V_{CM} \qquad (9)$$

Moreover, assuming that $C_2 = C_1/2$ and also $I_{211} = I_{151}$, Expression (9) can be rewritten with the following Expression (10).

$$V_{OUT} = -2V_{INAC} - 2V_{RC} + V_{DAC} + 2V_{CM} \qquad (10)$$

Additionally, assuming that $V_{CM} = V_{RC}$, Expression (10) can be rewritten with the following Expression (11).

$$V_{OUT} = -2V_{INAC} + V_{DAC} \qquad (11)$$

As can be understood from Expression (11), the output voltage $V_{OUT}$ is equal to a voltage provided by multiplying the alternating-current component ($V_{INAC}$) of the input voltage $V_{IN}$ by $-2$ and adding the adjustment voltage $V_{DAC}$. In other words, it is equal to taking a residual between $V_{INAC}$ and $V_{DAC}/2$ and multiplying this residual by $-2$. Further, assuming that $V_{DAC}$ is equal to the direct-current component of the input voltage $V_{IN}$, the alternating-current component $V_{INAC}$ can be amplified minus-twofold while fixing the direct-current component of the input voltage $V_{IN}$ by using the above-described numerical examples.

As described above, the amplification circuit including the voltage/time conversion circuit 3 and the time/voltage conversion circuit 4 resets the sampling capacitance on the input side and the sampling capacitance on the output side by using the same reset voltage at the same timing, and then amplifies the input voltage. Thus, according to this amplification circuit, a voltage mismatch between the input and the output at the start of the amplifying operation can be alleviated. Furthermore, this amplification circuit does not include a switch that carries out short-circuiting between the input and the output. Therefore, a reduction in isolation between the input and output and nonlinear distortions of this switch do not occur. Thus, according to this amplification circuit, power consumption can be reduced, and an accuracy can be improved.

1.4 Current Source

Figure 6:
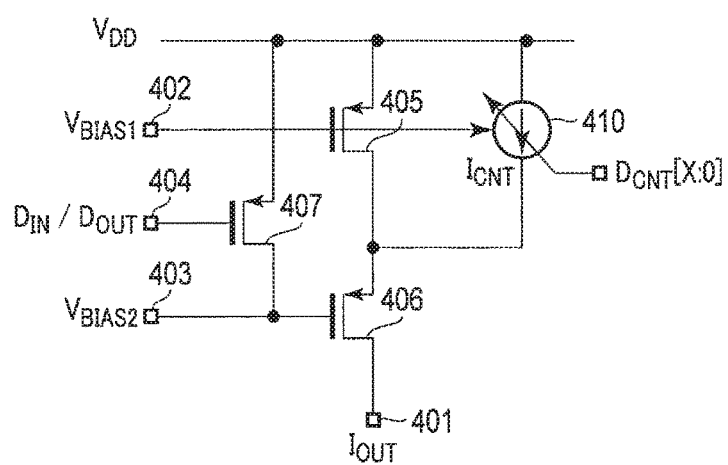
FIG. 6 is a circuit diagram showing a structural example of a current source in each of the voltage/time conversion circuit and the time/voltage conversion circuit according to the first embodiment.

As each of the current source 151 and the current source 211 described above, for example, a current source shown in FIG. 6 can be adopted. FIG. 6 is a circuit diagram showing a structural example of each of the current sources 151 and 211 in the voltage/time conversion circuit 3 and the time/voltage conversion circuit 4.

The current source has a current output terminal 401, a first bias terminal 402, a second bias terminal 403, and a control terminal 404. The current source further includes a transistor 405, a transistor 406, a transistor 407, and a variable current section 410. It is to be noted that the transistors 405, 406, and 407 are shown as metal oxide semiconductor (MOS) field-effect transistors in FIG. 6, but they may be substituted by different types of transistors.

The current source outputs a constant current signal through the current output terminal 401 over a period that a time signal or an amplification time signal input through the control terminal 404 keeps the transistor 407 as a switch OFF. For example, the constant current signal has an amount of an electric current $I_{OUT}$ determined based on an element size of the transistor 405 and a voltage $V_{BIAS1}$ of the first bias terminal 402.

The transistor 405 has a source terminal connected to a power supply, a gate terminal connected to the first bias terminal 402, and a drain terminal connected to a source terminal of the transistor 406. As described above, the element size of the transistor 405 determines the amount of the electric current $I_{OUT}$ the constant current signal output through the current output terminal 401 has.

The transistor 406 has the source terminal connected to the drain terminal of the transistor 405, a gate terminal connected to the second bias terminal 403, and a drain terminal connected to the current output terminal 401. The transistor 406 is cascode-connected to the transistor 405, and functions to increase an output resistance value.

The transistor 407 has a source terminal connected to the power supply, a gate terminal connected to the control terminal 404, and a drain terminal connected to the second bias terminal 403. The transistor 407 functions as a switch.

Specifically, the transistor 407 performs short-circuiting between the power supply and the gate terminal of the transistor 406 over a period that the time signal or an amplification time signal $D_{IN}/D_{OUT}$ input through the control terminal 404 is on the "L" level. Consequently, the transistor 406 is turned off, and hence the current source shown in FIG. 6 does not output the constant current signal. On the other hand, the transistor 407 performs open-circuiting between the power supply and the gate terminal of the transistor 406 over a period that the time signal or the amplification time signal $D_{IN}/D_{OUT}$ input through the control terminal 404 is on the "H" level. Consequently, the transistor 406 is turned on, and hence the current source outputs the constant current signal.

The variable current section 410 finely adjusts an amount of the electric current the constant current signal has by adding or subtracting a small amount of the electric current to or from a drain current of the transistor 405. A fluctuation of the drain current that may possibly occur due to an influence of an element mismatch or the like can be compensated by providing the variable current section 410. The amount of the electric current output by the variable current section 410 is controlled based, on the digital control signal $D_{CNT}[X:0]$ of (X+1) bits. X is an integer that is not smaller than 0.

Specifically, in this embodiment, the variable current section 410 shown in FIG. 7 may be adopted. FIG. 7 is a circuit diagram of the variable current section 410 in the current source shown in FIG. 6.

The variable current section 410 includes (X+1) sub-current sources 411. Each sub-current source 411 includes an inverter 412, a transistor 413, a transistor 414, and a transistor 415. It is to be noted that the transistors 413, 414, and 415 are shown as MOS field-effect transistors in FIG. 7, but they may be substituted by different types of transistors.

The inverter 412 receives a predetermined 1-bit digital signal in the digital control signal $D_{CNT}[X:0]$ of (X+1) bits. The inverter 412 inverts a logic of the received i-bit digital signal, and outputs the inverted signal to a gate terminal of the transistor 415.

The transistor 413 has a source terminal connected to the power supply, a gate terminal connected to a source terminal of the transistor 414 and a drain terminal of the transistor 415, and a drain terminal connected to the current output terminal. Each sub-current source 411 outputs the constant current signal through the current output terminal over a period that the transistor 413 is ON. This constant current signal is determined based on an element size of the transistor 413 and the voltage $V_{BIAS1}$ of the bias terminal.

The transistor 414 has a drain terminal connected the bias terminal, a gate terminal connected to an input terminal of the inverter 412, and the source terminal connected to the gate terminal of the transistor 413. The transistor 414 functions as a switch.

Specifically, the transistor 414 performs short-circuiting between the bias terminal and the gate terminal of the transistor 413 over a period that the 1-bit digital signal input to the inverter 412 is on the "L" level. Consequently, the transistor 413 is turned on. On the other hand, the transistor 414 performs open-circuiting between the bias terminal and the gate terminal of the transistor 413 over a period that the 1-bit digital signal input to the inverter 412 is on the "H" level. Consequently, the transistor 413 is turned off.

The transistor 415 has a source terminal connected to the power supply, the gate terminal connected to an output terminal of the inverter 412, and the drain terminal connected to the gate terminal of the transistor 413. The transistor 415 functions as a switch.

Specifically, short-circuiting is performed between the power supply and the gate terminal of the transistor 413 over a period that the 1-bit digital signal output from the inverter 412 is on the "L" level. Consequently, the transistor 413 is turned off. On the other hand, open-circuiting is performed between the bias terminal and the gate terminal of the transistor 413 over a period that the 1-bit digital signal output from the inverter 412 is on the "H" level. Consequently, the transistor 413 is turned on.

Moreover, as each of the current source 151 and the current source 211, for example, a current source shown in FIG. 8 can be adopted. FIG. 8 is a circuit diagram showing another structural example of each of the current sources 151 and 211 in the voltage/time conversion circuit 3 and the time/voltage conversion circuit 4.

The current source shown in FIG. 8 has a current output terminal 401, a first bias terminal 402, a second bias terminal 403, and a control terminal 404. The current source further includes a driver 420, a transistor 421, a transistor 422, a transistor 423, a transistor 424, and a variable current section 410. In this circuit, the use of the driver 420 enables high-speed switching at the time of outputting the constant current signal. It is to be noted that the transistors 421, 422, 423, and 424 are shown as metal oxide semiconductor (MOS) field-effect transistors in FIG. 8, but they may be substituted by different types of transistors.

2. Operation of AD Conversion Circuit

Figure 9:
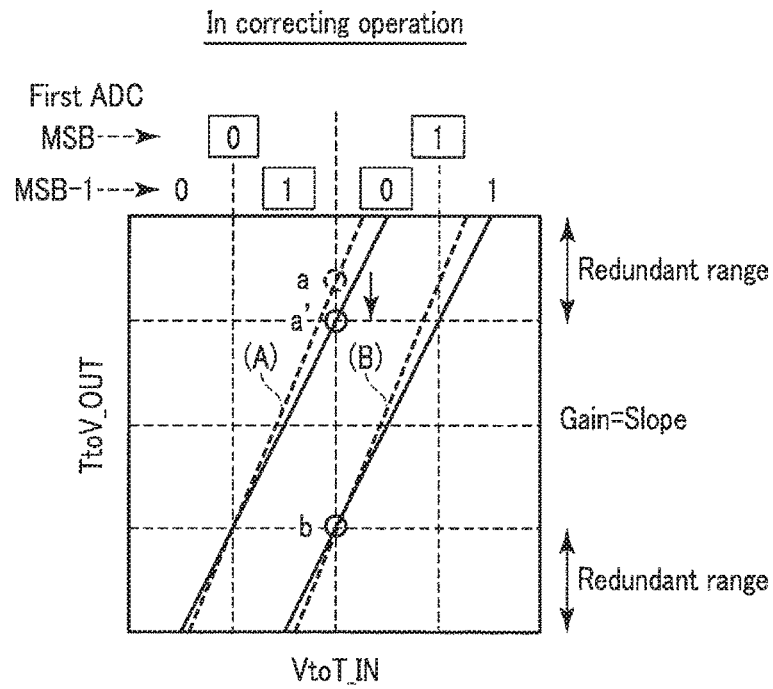
FIG. 9 is a view showing input/output characteristics of the voltage/time conversion circuit and the time/voltage conversion circuit in a correcting operation according to the first embodiment.

An outline of a gain correcting operation in the AD conversion circuit according to the first embodiment will now be described. FIG. 9 shows a relationship between an input (VtoT_IN) of the voltage/time conversion circuit 3 and an output (TtoV_OUT) of the time/voltage conversion circuit 4 in a correcting operation. The outline of the correcting operation is as follows.

First, an input voltage of the AD conversion circuit 10 is fixed. Additionally, outputs of the first analog/digital converter 2 are fixed to two codes, i.e., a code "A" and a code "B" (A: 01 and B: 10 in FIG. 9). MSB (the most significant bit) and MSB−1 (a bit lower than the most significant bit by 1) shown in FIG. 9 have 0 and 1 as the code "A" and 1 and 0 as the code "B", respectively. Two types of input/output characteristics can be drawn by using the fixed codes as shown in FIG. 9. Outputs from the time/voltage conversion circuit 4 with the code "A" and the code "B" are acquired by the second analog/digital converter 5 (acquisition results are a and b). A broken line (A) represents characteristics provided when the output from the time/voltage conversion circuit 4 with the code "A" is acquired by the second analog/digital converter 5. A broken line (B) represents characteristics provided when the output from the time/voltage conversion circuit 4 with the code "B" is acquired by the second analog/digital converter 5.

Here, a current value of at least one of the current source 151 in the voltage/time conversion circuit 3 and the current source 211 in the time/voltage conversion circuit 4 is adjusted with the use of the digital control signal $D_{CNT}[X:0]$ output from the digital processing circuit 6 so that a code width provided by setting a difference between a and b can be realized. That is, as shown in FIG. 9, the adjustment is performed to turn a to a'.

Figure 10:
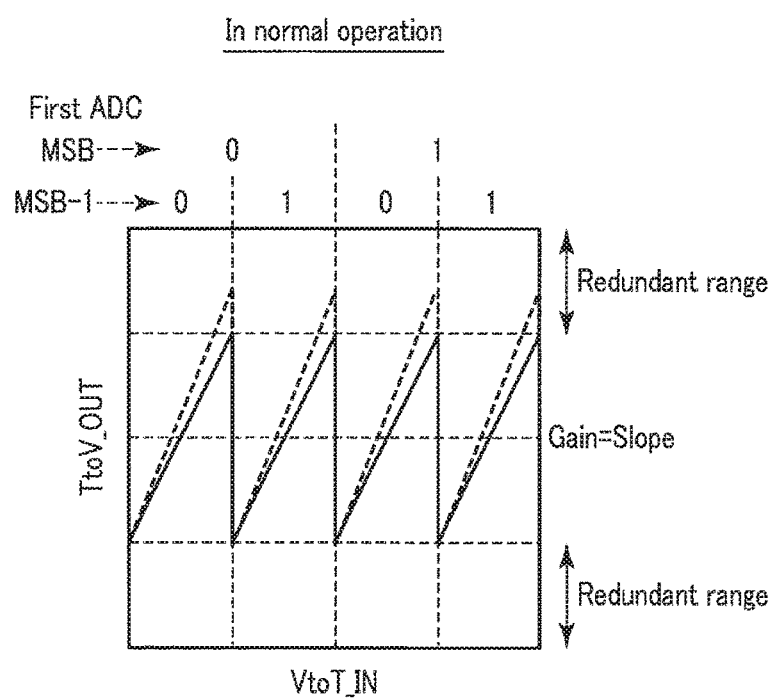
FIG. 10 is a view showing input/output characteristics of the voltage/time conversion circuit and the time/voltage conversion circuit in a normal operation.

FIG. 10 shows a relationship between an input of the voltage/time conversion circuit 3 and an output of the time/voltage conversion circuit 4 in a normal operation. In the drawing, a broken line represents a case where output characteristics have an error, and a solid line represents a case where the output characteristics have no error. When the correcting operation is executed, the error in the output characteristics can be reduced, and the broken line and the solid line substantially coincide with each other.

2.1 Correcting Operation

Figure 11:
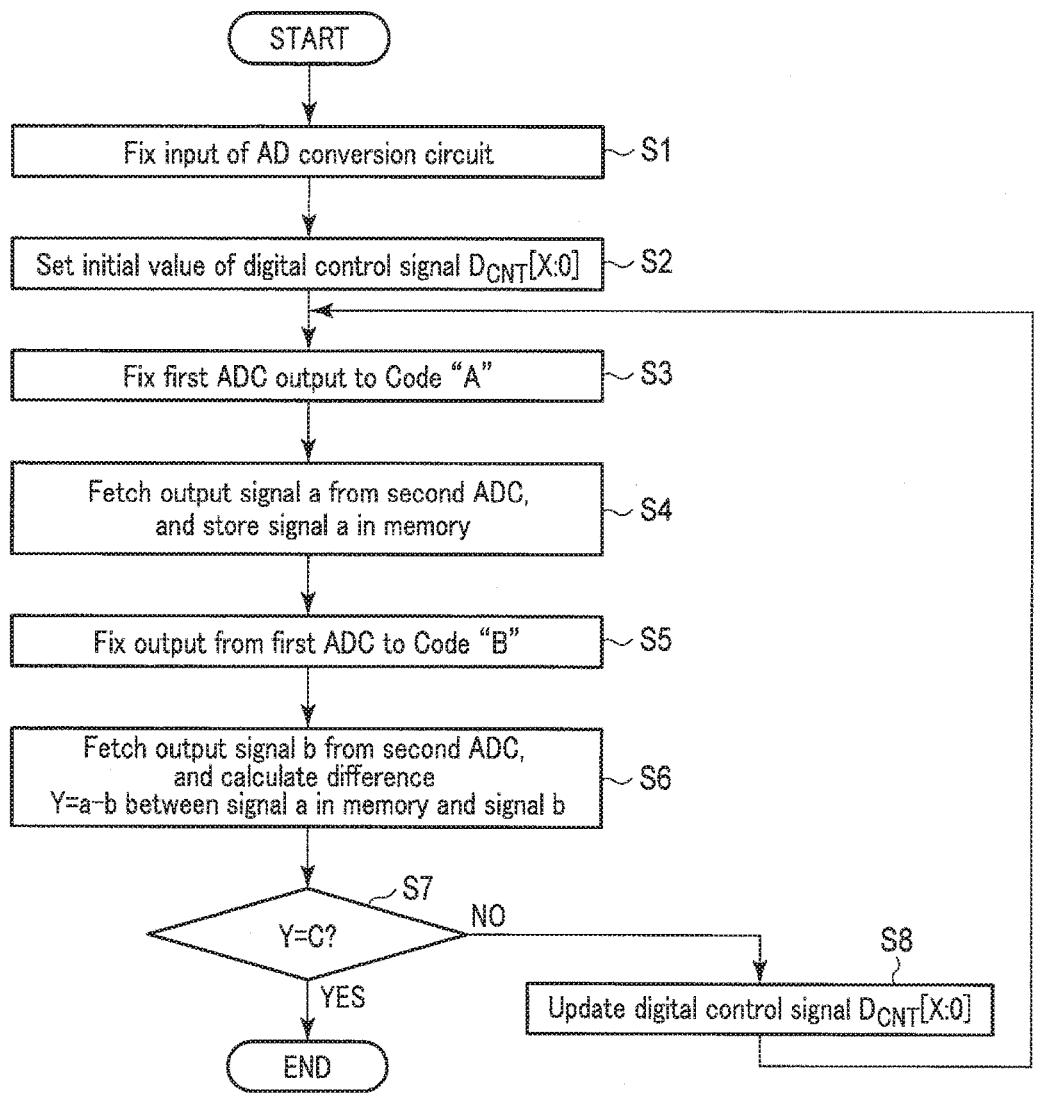
FIG. 11 is a flowchart showing the correcting operation in the AD conversion circuit according to the first embodiment.

The correcting operation in the AD conversion circuit 10 according to the first embodiment will now be described with reference to FIG. 11. FIG. 11 is a flowchart showing the correcting operation in the AD conversion circuit 10.

First, an input voltage to the AD conversion circuit 10 is fixed by the setting circuit 1 (a step S1). Subsequently, the digital processing circuit 6 sets an initial value of the digital control signal $D_{CNT}[X:0]$. The digital control signal $D_{CNT}[X:0]$ is a signal to adjust a current value of at least one of the current sources in the voltage/time conversion circuit 3 and the time/voltage conversion circuit 4 (a step S2).

Then, outputs from the first analog/digital converter 2 are fixed to the code "A" (a step S3). The code "A" output from the first analog/digital converter 2 is converted by the voltage/time conversion circuit 3, and output as a time signal. This time signal is converted by the time/voltage conversion circuit 4, and output as a voltage signal. Furthermore, the voltage signal is converted by the second analog/digital converter 5, and output as a digital signal a.

Subsequently, the digital processing circuit 6 fetches the digital signal a output from the second analog/digital converter 5. Moreover, the digital signal a is stored in a memory in the digital processing circuit 6 (a step S4).

Then, outputs from the first analog/digital converter 2 are fixed to the code "B" (a step S5). The code B output from the first analog/digital converter 2 is converted by the voltage/time conversion circuit 3, and output as a time signal. This time signal is converted by the time/voltage conversion circuit 4, and output as a voltage signal. Additionally, this voltage signal, is converted by the second analog/digital converter 5, and output as a digital signal b.

Subsequently, the digital processing circuit 6 fetches the digital signal b output from the second analog/digital converter 5. Further, the digital processing circuit 6 calculates a difference Y between the signal a stored in the memory and the signal b (a step S6).

Then, the digital processing circuit 6 compares the difference Y with a predetermined value C, and determines whether or not Y is equal to C (a step S7). If Y is not equal to C, the digital control signal $D_{CNT}[X:0]$ is updated so that Y approximates C (a step S8). That is, the digital processing circuit 6 updates the digital control signal $D_{CNT}[X:0]$ to adjust a current value of at least one of the current sources in the voltage/time conversion circuit 3 and the time/voltage conversion circuit 4, and exercises control so that Y approximates C.

After updating the digital control signal $D_{CNT}[X:0]$ at the step S8, the processing advances to the step S3, and the processing of the step S3 and subsequent steps is executed. Additionally, the processing of the step S3 to the step S7 is repeated until Y becomes equal to C, and the correcting operation is terminated when Y is equal to C.

It is to be noted that the digital control, signal $D_{CNT}[X:0]$ can be updated by binary search or round robin. If the binary search is used, an initial, value is set to an intermediate code. Further, if the round robin is used, the initial value is set to a code at the end part.

Furthermore, when outputs from the first analog/digital converter 2 are fixed to the code "A" and the code "B", a voltage to be fixed is selected by the setting circuit 1 to prevent the second analog/digital converter 5 from overflowing. For example, in a case where the codes "A" and "B" are set to two intermediate codes, an input common mode voltage can be selected as a fixed voltage to be input if the analog/digital converter adopts a differential input mode, or an intermediate voltage can be selected as the fixed voltage to be input if the same adopts a single-phase input mode.

Moreover, the predetermined value C is a full-scale code that is input to the second analog/digital converter 5. For example, in a case where a full scale of the second analog/digital converter is 8 bits, the predetermined value C becomes 256 (decimal) when the full range is used, or this value becomes 128 (decimal) when the half range is redundantly used.

2.2 Another Example of Correcting Operation

Another correcting operation in the AD conversion circuit 10 will now be described with reference to FIG. 12. FIG. 12 is a flowchart showing another correcting operation in the AD conversion circuit 10.

Like the operation shown in FIG. 11, first, an input voltage to the AD conversion circuit 10 is fixed by the setting circuit 1 (the step S1). Then, the digital processing circuit 6 sets an initial value of the digital control signal $D_{CNT}[X:0]$. The digital control signal $D_{CNT}[X:0]$ is a signal to adjust a current value of at least one of the current sources in the voltage/time conversion circuit 3 and the time/voltage conversion circuit 4 (the step S2).

Then, the digital processing circuit 6 sets the number of times i to 0 (a step S2a). Subsequently, outputs from the first analog/digital converter 2 are set to the code "A" (the step S3). The code "A" is converted by the voltage/time conversion circuit 3 and the time/voltage conversion circuit 4, and output as a voltage signal. Further, this voltage signal is converted by the second analog/digital converter 5, and output as a digital signal a.

Subsequently, the digital processing circuit 6 fetches the digital signal a output from the second analog/digital converter 5, and stores the digital signal a in a first memory in the digital processing circuit 6 (the step S4).

Then, outputs from the first analog/digital converter 2 are fixed to the code "B" (the step S5). The code "B" is converted by the voltage/time conversion circuit 3 and the time/voltage conversion circuit 4, and output as a voltage signal. Furthermore, this voltage signal is converted by the second analog/digital converter 5, and output as a digital signal b.

Subsequently, the digital processing circuit 6 fetches the digital signal b output from the second analog/digital converter 5. Moreover, the digital processing circuit 6 calculates a difference Y between the signal a stored in the first memory and the signal b. Additionally, Y is added to a value stored in a second memory in the digital processing circuit 6 (a step S6a).

Then, the digital processing circuit 6 determines whether the number of times i is smaller than N (a step S6b). If the number of times i is smaller than N, i is incremented (a step S6c), and the processing returns to the step S3. Further, the processing of the step S3 to the step S6b is repeated until the number of times i becomes equal to or larger than N, and the processing advances to a step S6d when i becomes equal to or larger than N. At the step S6d, an average value of Y stored in the second memory is calculated.

Then, the digital processing circuit 6 compares the average value Y with the predetermined value C, and determines whether Y is equal to C (the step S7). If Y is not equal to C, the digital control signal $D_{CNT}[X:0]$ is updated so that Y approximates C (the step S8). That is, the digital processing circuit 6 updates the digital control signal $D_{CNT}[X:0]$ to adjust a current value of at least one of the current sources in the voltage/time conversion circuit 3 and the time/voltage conversion circuit 4, and exercises control so that Y approximates C.

After updating the digital control signal $D_{CNT}[X:0]$ at the step $8, the processing advances to the step S2a, and the processing of the step S2a and subsequent steps is executed. Additionally, the processing of the step S2a to the step S7 is repeated until Y becomes equal to C, and the correcting operation is terminated when Y is equal to C. Any other configuration is the same as the operation shown in FIG. 11.

In the first embodiment, a current value of at least one of the current sources in the voltage/time conversion circuit 3 and the time/voltage conversion circuit 4 is adjusted by updating the digital control signal. $D_{CNT}[X:0]$ so that a deviation amount of gains of the amplification circuit including the voltage/time conversion circuit 3 and the time/voltage conversion circuit 4 can be reduced. Consequently, the gains of the amplification circuit including the voltage/time conversion circuit 3 and the time/voltage conversion circuit 4 can be adjusted to appropriate values, and the AD conversion circuit that can execute the highly accurate analog/digital conversion can be realized.

When the amplitude adjustment is performed in the amplification circuit in an analog manner, a gain of the second analog/digital converter is reduced due to a wiring resistance, and an error is produced in the AD conversion circuit in some cases. As the technique of this proposal executes the gain correction through the second analog/digital converter, the correction can be effected while being affected by the wiring resistance.

Second Embodiment

An analog/digital conversion circuit according to a second embodiment will now be described. In the second embodiment, gains of an amplification circuit including a voltage/time conversion circuit 3 and a time/voltage conversion circuit 4 are adjusted by variable capacitors connected to current source ends in a voltage/time conversion circuit 3 and a time/voltage conversion circuit 4. Here, structures different from the first embodiment will be described. Other structures are the same as the first embodiment, and hence a description thereof will be omitted.

1. Voltage/Time Conversion Circuit

Figure 13:
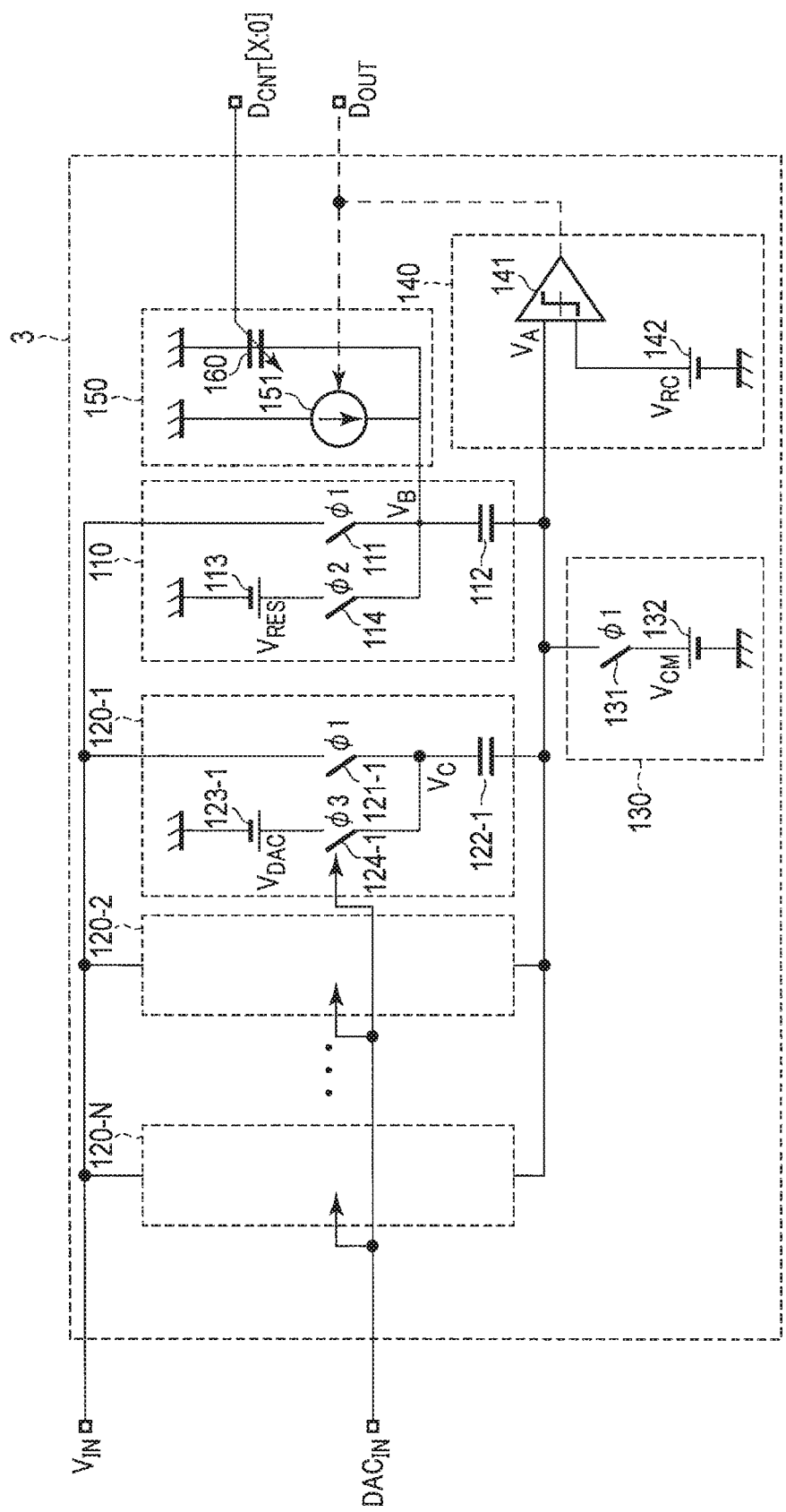
FIG. 13 is a circuit diagram showing a configuration of a voltage/time conversion circuit in an AD conversion circuit according to a second embodiment.

FIG. 13 is a circuit diagram showing a configuration of a voltage/time conversion circuit 3 in the second embodiment. Although the signal generation circuit 150 shown in FIG. 2A has the current adjustment terminal at the current source 151, a variable capacitor 160 is connected to an output terminal of the current source 151 without providing the current adjustment terminal in the second embodiment. A capacitance of the variable capacitor 160 can be changed in accordance with a digital control signal $D_{CNT}[X:0]$. Other structures are the same as the voltage/time conversion circuit 3 shown in FIG. 2A.

2. Time/Voltage Conversion Circuit

FIG. 14 is a circuit diagram showing a configuration of the time/voltage conversion circuit 4 in the second embodiment. Although the signal generation circuit 210 shown in FIG. 4 has the current adjustment terminal at the current source 211, the variable capacitor 160 is connected to an output terminal of the current source 211 without providing the current adjustment terminal in the second embodiment. A capacitance of the variable capacitor 160 can be changed in accordance with the digital control signal $D_{CNT}[X:0]$. Other structures are the same as the time/voltage conversion circuit 4 shown in FIG. 4.

3. Variable Capacitor

FIG. 15 is a circuit diagram of the variable capacitor 160 in each of the voltage/time conversion circuit 3 and the time/voltage conversion circuit 4. As shown in the drawing, the variable capacitor 160 includes (X+1) sub-capacitance sections 161. Each sub-capacitance section 161 includes an inverter 162, a transistor 163, and a capacitor 164.

The inverter 162 receives a predetermined 1-bit digital signal in the digital control signal $D_{CNT}[X:0]$ of (X+1) bits. The inverter 162 inverts a logic of the received 1-bit digital signal, and outputs the inverted signal to a gate terminal of the transistor 163.

The transistor 163 has a source terminal connected to a power supply $V_{DD}$ (or a reference voltage $V_{SS}$), a gate terminal connected to an output terminal of the inverter 162, and a drain terminal connected to a current output terminal through the capacitor 164. Each sub-capacitance section 161 charges the capacitor 164 with electric charges through the transistor 163 during a period that the transistor 163 is ON. On the other hand, the capacitor 164 is not charged with electric charges during a period that the transistor 163 is OFF. Charging some capacitors 164 in the (X+1) sub-capacitance sections 164 by the operation realizes adjustment of the capacitance of the variable capacitor 160.

In the second embodiment, the capacitance of the variable capacitor 160 connected to at least one of the current sources in the voltage/time conversion circuit 3 and the time/voltage conversion circuit 4 is adjusted by updating the digital control signal $D_{CNT}[X:0]$ so that a deviation amount of gains of the amplification circuit including the voltage/time conversion circuit 3 and the time/voltage conversion circuit 4 can be reduced. Consequently, the gains of the amplification circuit including the voltage/time conversion circuit 3 and the time/voltage conversion circuit 4 can be adjusted to appropriate values, and the AD conversion circuit that can execute the highly accurate analog/digital conversion can be realized.

Third Embodiment

An AD conversion circuit according to a third embodiment will now be described. Although the voltage/time conversion circuit 3 having the digital/analog conversion function has been described in the first and second embodiments, an example where the digital/analog conversion function is removed from the voltage/time conversion 3 and separately provided will be described in the third embodiment.

1. Configuration of AD Conversion Circuit

FIG. 16 is a block diagram showing a configuration of the AD conversion circuit according to the third embodiment.

As shown in the drawing, the AD conversion circuit 20 includes a setting circuit 1, a first analog/digital converter (ADC) 2, a voltage/time conversion circuit 3a, a time/voltage conversion circuit 4, a second analog/digital converter (ADC) 5, a digital processing circuit 6, and a digital/analog converter 7.

Here, the voltage/time conversion circuit 3a different from the first embodiment will be described. The digital/analog converter 7 has the regular configuration, other structures are the same as those in the first embodiment, and hence a description thereof will be omitted.

Figure 17:
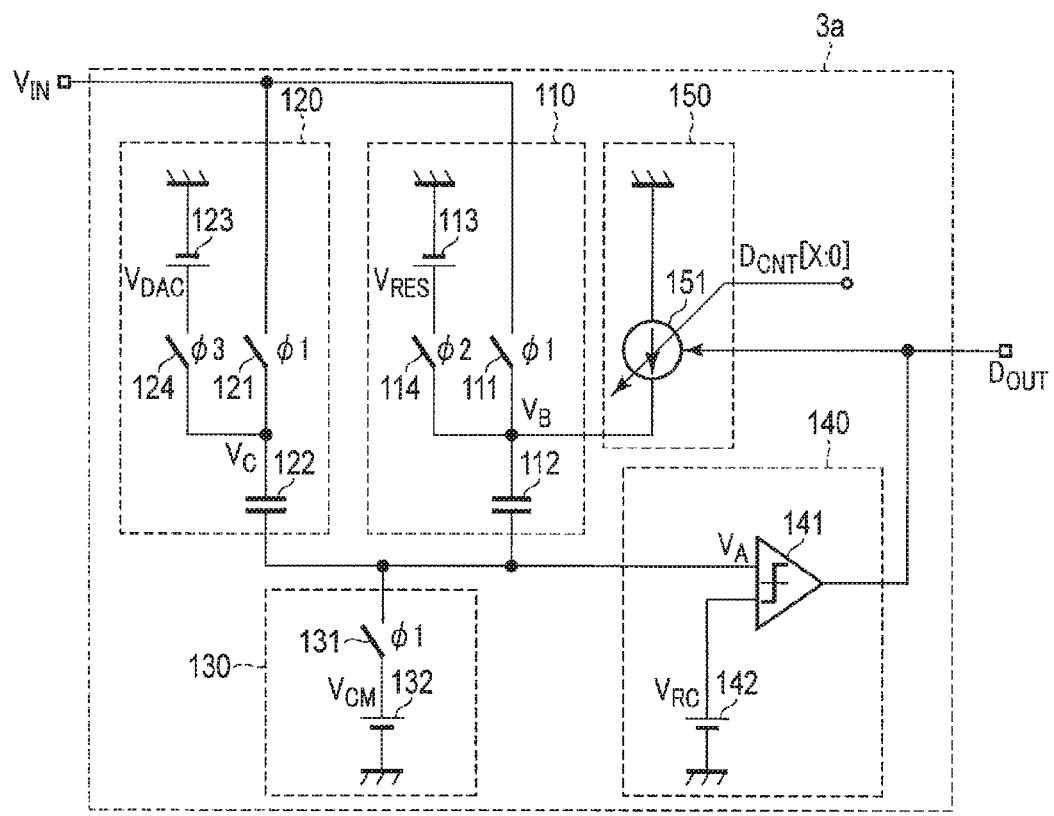
FIG. 17 is a circuit diagram showing a configuration of a voltage/time conversion circuit in the AD conversion circuit according to the third embodiment.

The voltage/time conversion circuit 3a will be described with reference to FIG. 17. FIG. 17 is a circuit diagram showing a configuration of the voltage/time conversion circuit 3a. The voltage/time conversion circuit 3a is provided by eliminating the digital/analog conversion function from the voltage/time conversion circuit 3 shown in FIG. 2A. Furthermore, as the second sampling circuit, a single second sampling circuit 120 is shown. As a matter of course, N second sampling circuits may be provided.

An input voltage and an output from the first analog/digital converter 2 are subjected to the digital/analog conversion by the digital/analog converter 7, and a value provided by adding or subtracting these conversion results is input to the voltage/time conversion circuit 3a. Other structures and effects are the same as the first embodiment.

2. Modification

As a modification, a function of the first analog/digital converter 2 may be included in the voltage/time conversion circuit 3 having the digital/analog conversion function. FIG. 18 is a circuit diagram showing a configuration of a voltage/time conversion circuit 3b according to the modification. The voltage/time conversion circuit 3b is provided by adding a detector 1160 and a successive approximation type (SAR) logic 1170 to the voltage/time conversion circuit 3 shown in FIG. 2A.

As shown in FIG. 18, the detector 1160 includes a voltage source 1161 and a comparator 1162. The comparator 1162 includes a first input terminal, a second input terminal, and an output terminal. To the first input terminal of the comparator 1162 are connected second terminals of sampling capacitances 112, 122-1, . . . , 122-N, a first terminal of a comparator 141, and one end of a switch 131. The voltage source 1161 has a positive electrode terminal and a negative electrode terminal. A second input terminal of the comparator 1162 is connected to the positive electrode terminal of the voltage source 1161. The negative electrode terminal of the voltage source 1161 is grounded. The voltage source 1161 generates a comparative reference voltage $V_{RC2}$. The comparative reference voltage $V_{RC2}$ may be the same as an intermediate voltage $V_{CM}$. Moreover, an output terminal of the comparator 1162 is connected to an input terminal of the SAR logic 1170.

The comparator 1162 operates in synchronization with a clock signal CLK. When the comparator 1162 detects a rising edge (or a falling edge) of the clock signal CLK, it compares a voltage at the first input terminal with a voltage at the second input terminal. It is to be noted that the comparator 1162 stops its operation in a sample phase or a conversion phase of the voltage/time conversion circuit 3b.

Specifically, if the voltage at the first input terminal is smaller than the voltage at the second input terminal, the comparator 1162 outputs an "H"-level (a power supply voltage) digital signal. On the other hand, if the voltage at the first input terminal is not smaller than the voltage at the second input terminal, the comparator 1162 outputs an "L"-level (a ground voltage) digital signal.

The SAR logic 1170 has an input terminal, a digital output terminal, and a control output terminal. The input terminal of the SAR logic 1170 is connected to an output terminal of the comparator 1162. A control output terminal of the SAR logic 1170 is connected to N second sampling circuits 120-1, . . . , 120-N.

It is to be noted that the control output terminal of the SAR logic 1170 is connected to switches 124-1 included in the N second sampling circuits 120-1, . . . , 120-N. However, to control adjustment voltages in the N second sampling circuits 120-1, . . . , 120-N, the control output terminal of the SAR logic 1170 may be connected to other elements (e.g., a voltage source 123-1).

In a reset phase of the voltage/time conversion circuit 3b, the SAR logic 1170 periodically receives digital signals indicative of comparison results from the detector 1160. The SAR logic 1170 periodically generates control signals to control the adjustment voltages in the N second sampling circuits 120-1, . . . , 120-N in accordance with the digital signals, and outputs them through the control output terminal.

Moreover, the SAR logic 1170 acquires an output digital signal $ADC_{OUT}$ at the end of the reset phase by storing the digital signals input during the reset phase of the voltage/time conversion circuit 3b. The SAR logic 1170 outputs the output digital signal $ADC_{OUT}$ through the digital output terminal. Other structures and effects are the same as the first embodiment.

In the third embodiment, a current value of at least one of current sources in the voltage/time conversion circuit 3 and the time/voltage conversion circuit 4 is adjusted by updating a digital control signal $D_{CNT}[X:0]$ so that a deviation amount of gains of an amplification circuit including the voltage/time conversion circuit 3 and the time/voltage conversion circuit 4 can be reduced. Consequently, the gains of the amplification circuit including the voltage/time conversion circuit 3 and the time/voltage conversion circuit 4 can be adjusted to appropriate values, and the AD conversion circuit that can execute the highly accurate analog/digital conversion can be realized.

Fourth Embodiment

An AD conversion circuit according to a fourth embodiment will now be described. In the fourth embodiment, a digital output is corrected by multiplying an output from a first analog/digital converter 2 by a correction coefficient.

1. Configuration of AD Conversion Circuit

FIG. 19 is a block diagram showing a configuration of an AD conversion circuit according to the fourth embodiment. As shown in the drawing, the AD conversion circuit 30 includes a setting circuit 1, a first analog/digital converter 2, a voltage/time conversion circuit 3, a time/voltage conversion circuit 4, a second analog/digital converter 5, and a digital processing circuit 6a. Other structures and effects are the same as the first embodiment.

2. Operation of AD Conversion Circuit

An outline of a correcting operation in the AD conversion circuit 30 according to the fourth embodiment will now be described. FIG. 20 shows a relationship between an input of the voltage/time conversion circuit 3 and an output of the time/voltage conversion circuit 4 at the time of the correcting operation.

First, an input voltage of the AD conversion circuit 30 is fixed. Furthermore, outputs from the first analog/digital converter 2 are fixed to two codes, i.e., a code "A" and a code "B" (A: 01 and B: 10 in FIG. 20). MSB (the most significant bit) and MSB−1 (a bit lower than the most significant bit by 1) shown in FIG. 20 have 0 and 1 as the code "A" and 1 and 0 as the code "B", respectively. A ratio M of an ideal gain AOUT_Ide and a current gain AOUT is calculated (M=AOUT_Ide/AOUT) from outputs from the second analog/digital converter 5 by using the fixed codes as shown in FIG. 20. A broken line (A) represents characteristics provided when the output from the time/voltage conversion circuit 4 with the code "A" is acquired by the second analog/digital converter 5. A broken line (B) represents characteristics provided when the output from the time/voltage conversion circuit 4 with the code "B" is acquired by the second analog/digital converter 5.

At the time of a normal operation, a result provided by multiplying an output from the first analog/digital converter 2 by a coefficient M is used. It is to be noted that, if the system can allow gain errors, a multiplier may be provided in the second analog/digital converter 5.

Figure 21:
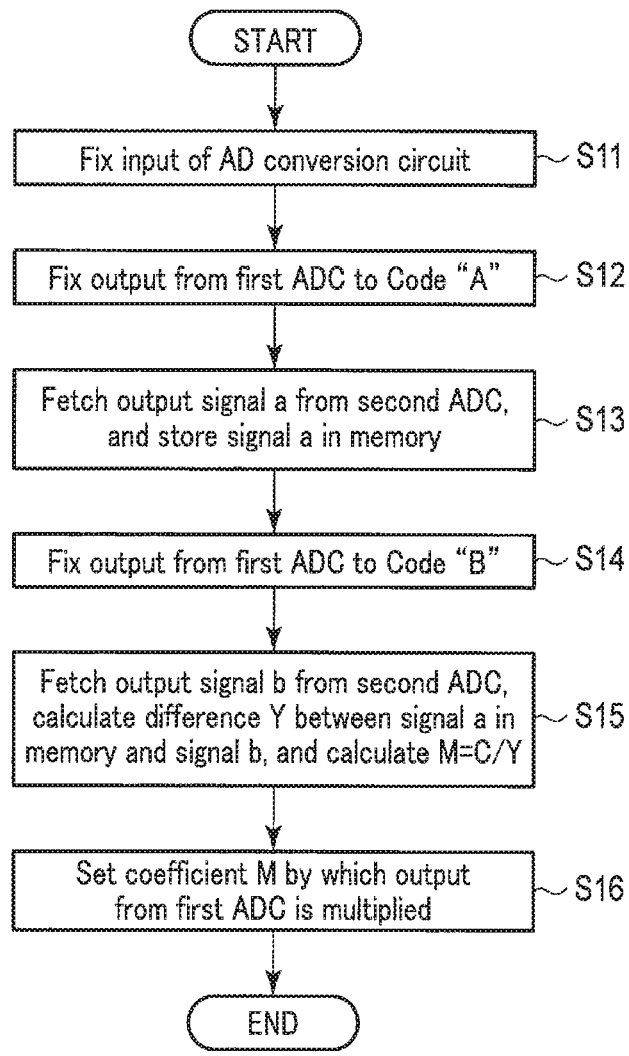
FIG. 21 is a flowchart showing the correcting operation in the AD conversion circuit according to the fourth embodiment.

The correcting operation in the AD conversion circuit 30 according to the fourth embodiment will now be described with reference to FIG. 21. FIG. 21 is a flowchart showing the correcting operation in the AD conversion circuit 30.

First, an input voltage to the AD conversion circuit 30 is fixed by the setting circuit 1 (a step S11).

Subsequently, outputs from the first analog/digital converter 2 are fixed to the code "A" (a step S12). The code "A" is converted by the voltage/time conversion circuit 3 and the time/voltage conversion circuit 4, and output as a voltage signal. Furthermore, this voltage signal is converted by the second analog/digital converter 5, and output as a digital signal a.

Subsequently, the digital processing circuit 6a fetches the digital signal a output from the second analog/digital converter 5. Moreover, the digital signal a is stored in a memory in the digital processing circuit 6a (a step S13).

Then, outputs from the first analog/digital converter 2 are fixed to the code "B" (a step S14). The code B is converted by the voltage/time conversion circuit 3 and the time/voltage conversion circuit 4, and output as a voltage signal. Additionally, this voltage signal is converted by the second analog/digital converter 5, and output as a digital signal b.

Subsequently, the digital processing circuit 6a fetches the digital signal b output from the second analog/digital converter 5. Further, the digital processing circuit 6 calculates a difference Y between the signal a stored in the memory and the signal b. Furthermore, it calculates a coefficient M based on "M=C/Y" (a step S15).

Then, the digital processing circuit 6a sets the coefficient M by which the output signal a from the first analog/digital converter 2 is multiplied (a step S16). Thus, the correcting operation is terminated.

In the fourth embodiment, the AD conversion circuit that can perform the highly accurate analog/digital conversion can be realized by multiplying an output from the first analog/digital converter 2 by the correction coefficient M so that a deviation amount of gains of an amplification circuit including the voltage/time conversion circuit 3 and the time/voltage conversion circuit 4 can be eliminated.

As described above, according to the embodiments, the analog/digital conversion circuit that can highly accurately convert an analog signal into a digital signal can be provided.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An analog/digital conversion circuit comprising:
a setting circuit which fixes an input to a first voltage;
a first analog/digital converter which converts the first voltage into a first digital signal;
a voltage/time conversion circuit comprising a first capacitor and a first current source which supplies an electric current to the first capacitor, the voltage/time conversion circuit acquiring a residual signal corresponding to a difference between the first voltage and a result of having converted the first digital signal into an analog signal, and converting the residual signal into a time signal in accordance with a voltage charged in the first capacitor;
a time/voltage conversion circuit comprising a second capacitor and a second current source which supplies an electric current to the second capacitor, the time/voltage conversion circuit converting the time signal into a voltage signal in accordance with a voltage charged in the second capacitor;
a second analog/digital converter which converts the voltage signal into a second digital signal; and a digital processing circuit which outputs a third digital signal to adjust a current value of at least one of the first current source and the second current source based on the second digital signal.

2. The circuit according to claim 1,
wherein the voltage/time conversion circuit further comprises a sampling circuit which includes a voltage source and a switch that performs short-circuiting or open-circuiting between the first capacitor and the voltage source.

3. The circuit according to claim 1,
wherein the time/voltage conversion circuit further comprises a sampling circuit which includes a voltage source and a switch that performs short-circuiting or open-circuiting between the second capacitor and the voltage source.

4. The circuit according to claim 1,
wherein the voltage/time conversion circuit further comprises a voltage source, a resistance ladder connected to the voltage source, and a switch which changes over a connection of the resistance ladder.

5. The circuit according to claim 2,
wherein the voltage/time conversion circuit comprises the first analog/digital converter, the first analog/digital converter sharing the voltage source, the first capacitor, and the switch with the voltage/time conversion circuit, and
the first analog/digital converter further comprises a successive approximation logic which controls the switch, and a detector which compares a voltage in the first capacitor with a reference voltage and outputs a comparison result to the successive approximation logic.

6. The circuit according to claim 1,
wherein the digital processing circuit fixes an input to the first voltage by using the setting circuit,
fixes outputs from the first analog/digital converter to a first code and a second code, respectively,
takes an output difference between an output from the second analog/digital converter for the first code and an output from the second analog/digital converter for the second code,
sets a correction coefficient based on the output difference; and
multiplies the outputs from the first analog/digital converter by the correction coefficient.

7. The circuit according to claim 6,
wherein the output difference of the second analog/digital converter is smaller than an input range of the second analog/digital converter.

8. The circuit according to claim 1,
wherein the digital processing circuit determines the third digital signal by binary search.

9. The circuit according to claim 1,
wherein the voltage/time conversion circuit further comprises a first variable capacitor, and the first current source supplies an electric current to the first variable capacitor,
the voltage/time conversion circuit converts the residual signal into a time signal in accordance with voltages charged in the first capacitor and the first variable capacitor,
the time/voltage conversion circuit further comprises a second variable capacitor, and the second current source supplies an electric current to the second variable capacitor, and the time/voltage conversion circuit converts the time signal into a voltage signal in accordance with voltages charged in the second capacitor and the second variable capacitor.

10. An analog/digital conversion circuit comprising:
a setting circuit which fixes an input to a first voltage;
a first analog/digital converter which converts the first voltage into a first digital signal;
a digital/analog converter which outputs a residual signal corresponding to a difference between the first voltage and a result of having converted the first digital signal into an analog signal;
a voltage/time conversion circuit which comprises a first capacitor and a first current source which supplies an electric current to the first capacitor, the voltage/time conversion circuit converting the residual signal into a time signal in accordance with a voltage charged in the first capacitor;
a time/voltage conversion circuit which comprises a second capacitor and a second current source which supplies an electric current to the second capacitor, the time/voltage conversion circuit converting the time signal into a voltage signal in accordance with a voltage charged in the second capacitor;
a second analog/digital converter which converts the voltage signal into a second digital signal; and
a digital processing circuit which outputs a third digital signal to adjust a current value of at least one of the first current source and the second current source based on the second digital signal.

11. The circuit according to claim 10,
wherein the voltage/time conversion circuit further comprises a sampling circuit which includes a voltage source and a switch that performs short-circuiting or open-circuiting between the first capacitor and the voltage source.

12. The circuit according to claim 10,
wherein the time/voltage conversion circuit further comprises a sampling circuit which includes a voltage source and a switch that performs short-circuiting or open-circuiting between the second capacitor and the voltage source.

13. The circuit according to claim 10,
wherein the voltage/time conversion circuit further comprises a voltage source, a resistance ladder connected to the voltage source, and a switch which changes over a connection of the resistance ladder.

14. The circuit according to claim 11,
wherein the voltage/time conversion circuit comprises the first analog/digital converter, the first analog/digital converter sharing the voltage source, the first capacitor, and the switch with the voltage/time conversion circuit, and
the first analog/digital converter further comprises a successive approximation logic which controls the switch, and a detector which compares a voltage in the first capacitor with a comparative voltage and outputs a comparison result to the successive approximation logic.

15. The circuit according to claim 10,
wherein the digital processing circuit fixes an input to the first voltage by using the setting circuit,
fixes outputs from the first analog/digital converter to a first code and a second code, respectively, takes an output difference between an output from the second analog/digital converter for the first code and an output from the second analog/digital converter for the second code, sets a correction coefficient based on the output difference; and multiplies the outputs from the first analog/digital converter by the correction coefficient.

16. The circuit according to claim 15, wherein the output difference of the second analog/digital converter is smaller than an input range of the second analog/digital converter.

17. The circuit according to claim 10, wherein the digital processing circuit determines the third digital signal by binary search.

18. The circuit according to claim 10, wherein the voltage/time conversion circuit further comprises a first variable capacitor, and the first current source supplies an electric current to the first variable capacitor, the voltage/time conversion circuit converts the residual signal into a time signal in accordance with voltages charged in the first capacitor and the first variable capacitor, the time/voltage conversion circuit further comprises a second variable capacitor, and the second current source supplies an electric current to the second variable capacitor, and the time/voltage conversion circuit converts the time signal into a voltage signal in accordance with voltages charged in the second capacitor and the second variable capacitor.

* * * * *